United States Patent [19]

Kreifels et al.

[11] Patent Number: 5,369,647
[45] Date of Patent: Nov. 29, 1994

[54] CIRCUITRY AND METHOD FOR TESTING A WRITE STATE MACHINE

[75] Inventors: Jerry Kreifels, Citrus Heights; Mickey L. Fandrich, Placerville, both of Calif.

[73] Assignee: Intel Corporation, Santa Clara, Calif.

[21] Appl. No.: 808,381

[22] Filed: Dec. 16, 1991

[51] Int. Cl.$^5$ ............................................ G01R 31/28
[52] U.S. Cl. ..................... 371/25.1; 365/201; 371/21.1
[58] Field of Search ............... 371/21.1, 21.2, 25.1, 371/22.1; 365/201; 395/575

[56] References Cited

U.S. PATENT DOCUMENTS

| | | | |
|---|---|---|---|
| 4,460,982 | 7/1984 | Gee et al. | 365/189 |
| 4,648,076 | 3/1987 | Schrenk | 365/230 |
| 4,701,886 | 10/1987 | Sakakibara et al. | 365/189 |
| 4,811,294 | 3/1989 | Kobayashi et al. | 365/189 |
| 4,823,308 | 4/1989 | Knight | 364/900 |
| 4,845,712 | 7/1989 | Sanner et al. | 371/25.1 |
| 5,014,191 | 5/1991 | Padgaonkar et al. | 364/200 |
| 5,034,992 | 7/1991 | Burgess | 365/189.07 |
| 5,049,814 | 9/1991 | Walker, III et al. | 324/158 R |
| 5,053,990 | 10/1991 | Kreifels et al. | 364/900 |
| 5,172,338 | 12/1992 | Mehrotra et al. | 365/185 |
| 5,222,046 | 6/1993 | Kreifels et al. | 365/230.06 |
| 5,224,070 | 6/1993 | Frandrich et al. | 365/185 |
| 5,243,575 | 9/1993 | Sambandan et al. | 365/233.5 |

FOREIGN PATENT DOCUMENTS 615869 1/1986 Japan.

*Primary Examiner*—Charles E. Atkinson
*Attorney, Agent, or Firm*—Blakely, Sokoloff, Taylor & Zafman

[57] ABSTRACT

A method is described for verifying the operation of next state logic within a write state machine for automatically programming and erasing a flash memory. Verification of the next state logic's operation begins by configuring the write state machine in a test mode. Afterward, the next state logic is cycled through its possible output states by providing the next state logic with all possible input states. Outputs from next state logic are compared to expected outputs, thereby verifying the operation of the next state logic. Also described is circuitry for verifying the operation of next state logic within a write state machine. The circuitry includes test registers for storing test signals. In response to the test signals a first means isolates the next state logic from the write state machine. A second means provides alternative inputs to the next state logic in response to the test signals. Also described is circuitry and methods of testing other circuits within the write state machine, such as, the address counter, period counter, data latch comparator, etc.

20 Claims, 24 Drawing Sheets

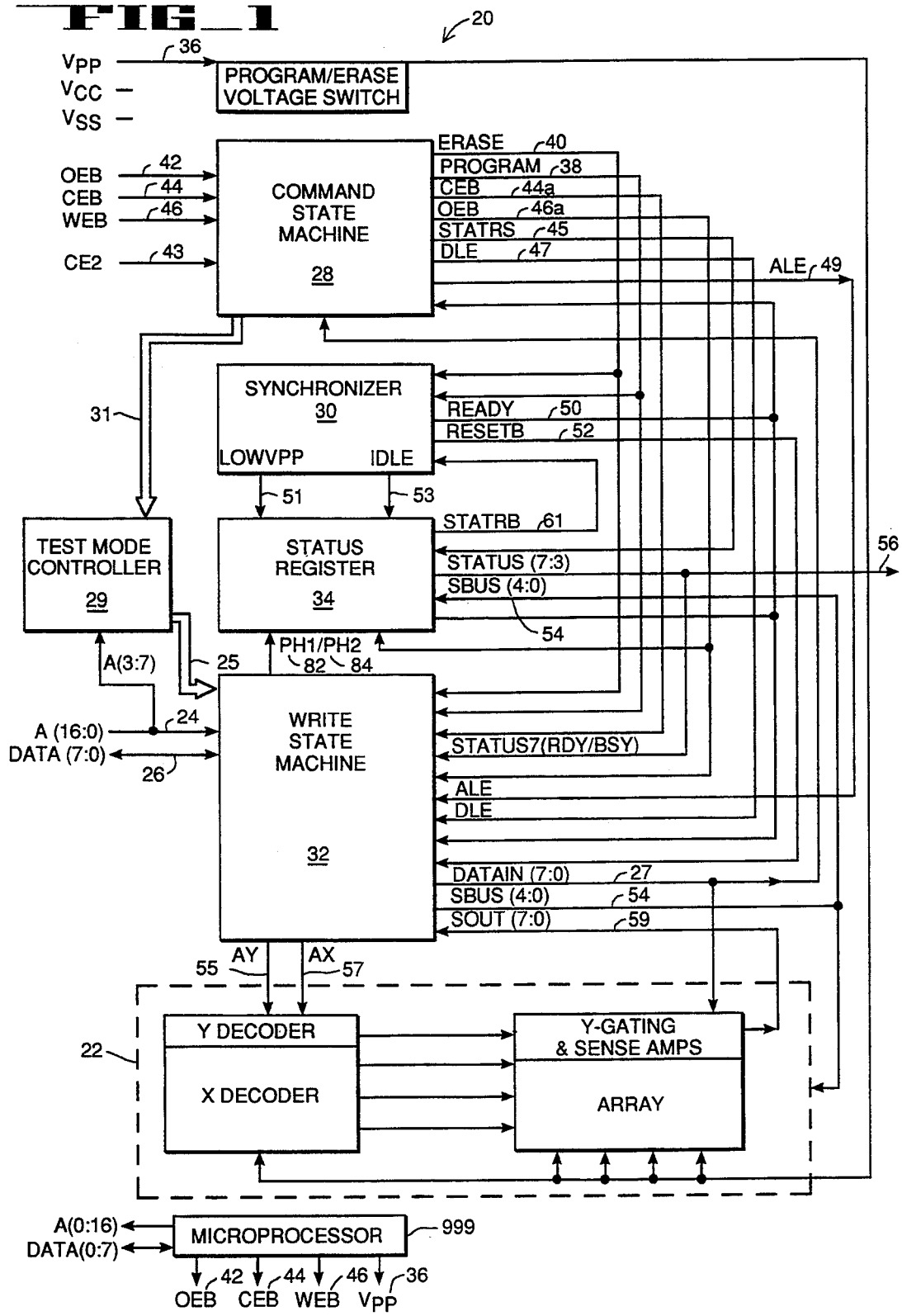

FIG_2

| COMMAND | BUS CYCLES REQUIRED | FIRST BUS CYCLE | | | SECOND BUS CYCLE | | |
|---|---|---|---|---|---|---|---|
| | | OPERATION | ADDRESS | DATA | OPERATION | ADDRESS | DATA |
| READ ARRAY | 1 | WRITE | X | FFH | | | |
| READ STATUS REGISTER | 2 | WRITE | X | 70H | READ | X | SRD |
| CLEAR STATUS REGISTER | 1 | WRITE | X | 50H | | | |
| ERASE SETUP/ERASE CONFIRM | 2 | WRITE | BA | 20H | WRITE | BA | D0H |
| PROGRAM SETUP/PROGRAM | 2 | WRITE | X | 40H | WRITE | PA | PD |
| WRITE TEST LATCH | 2 | WRITE | X | 5FH | WRITE | TEST REGISTERS | TD |
| TEST MODE GO | 1 | WRITE | X | 2FH | | | |
| TEST MODE STOP | 1 | WRITE | X | 3FH | | | |
| USER MODE READS | 1 | WRITE | X | 1FH | | | |
| READ TEST LATCH | 1 | WRITE | X | 0FH | | | |

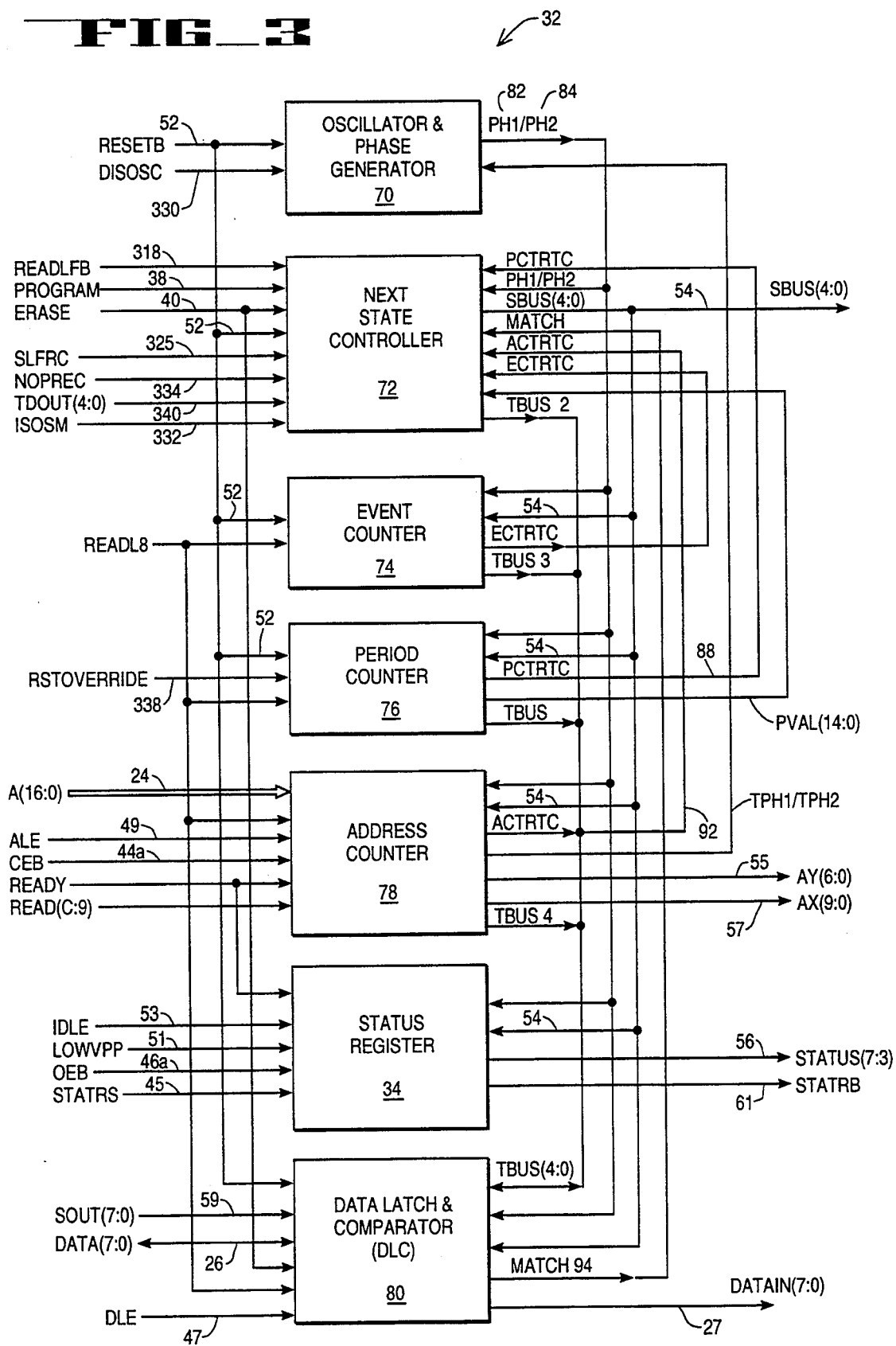

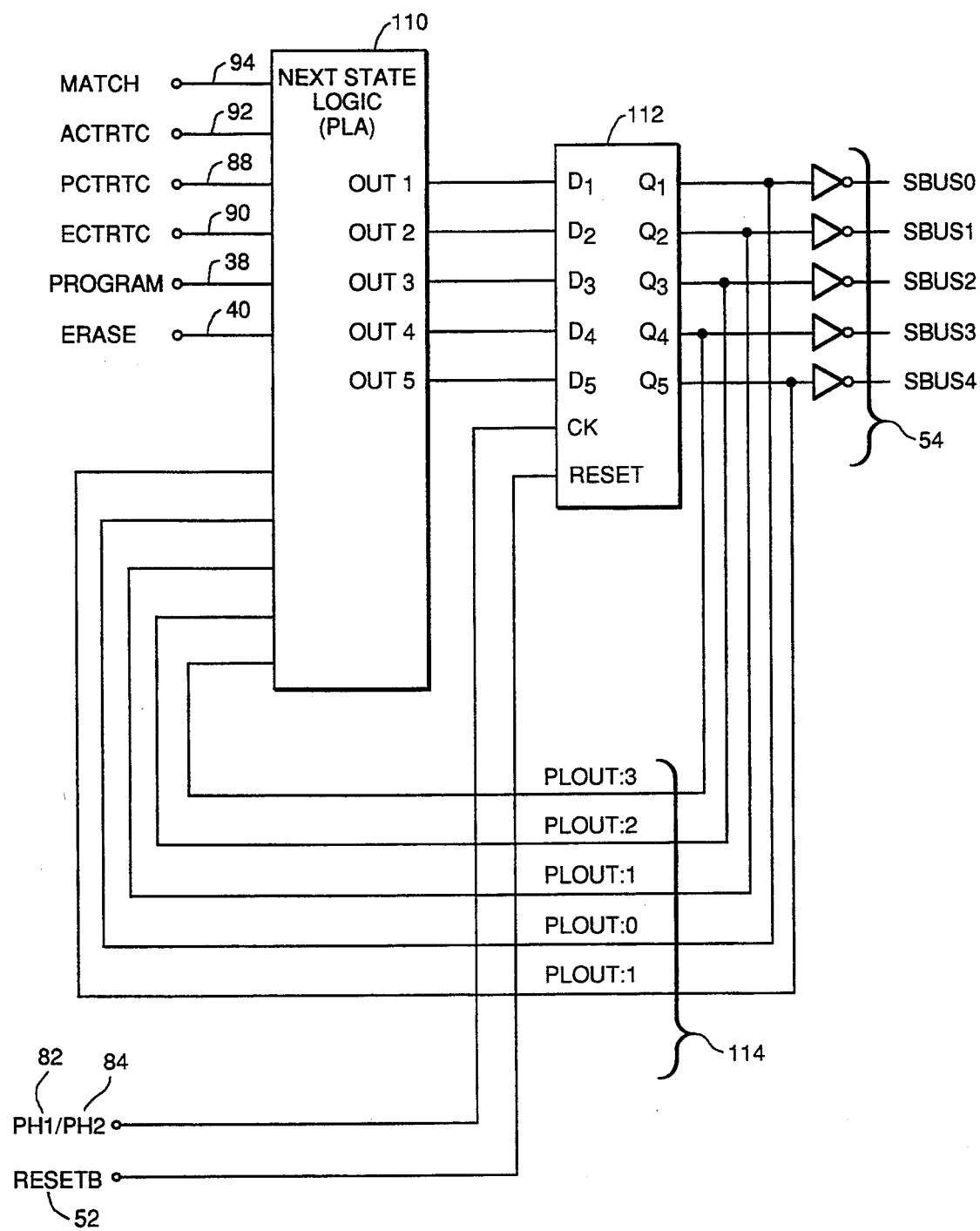

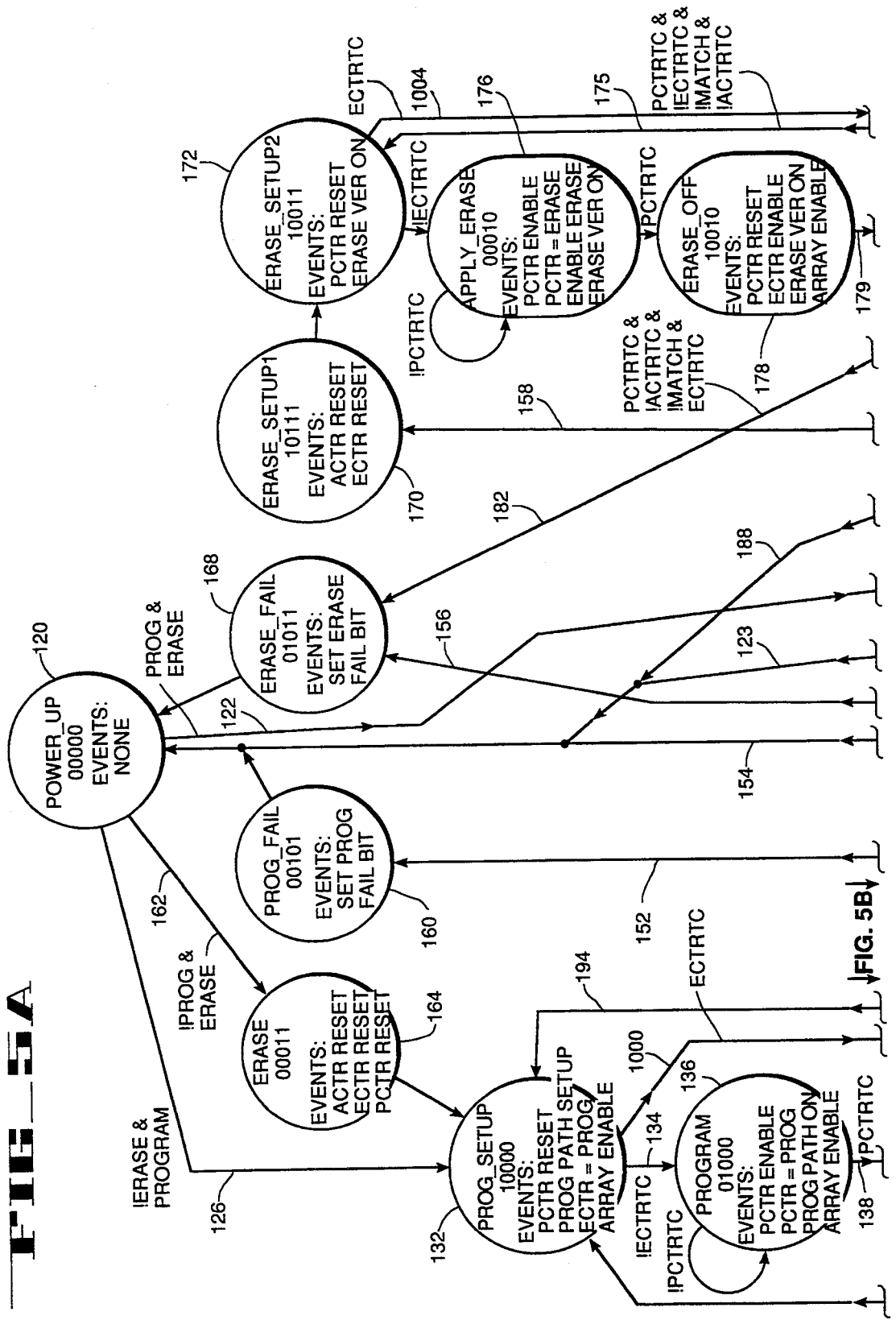

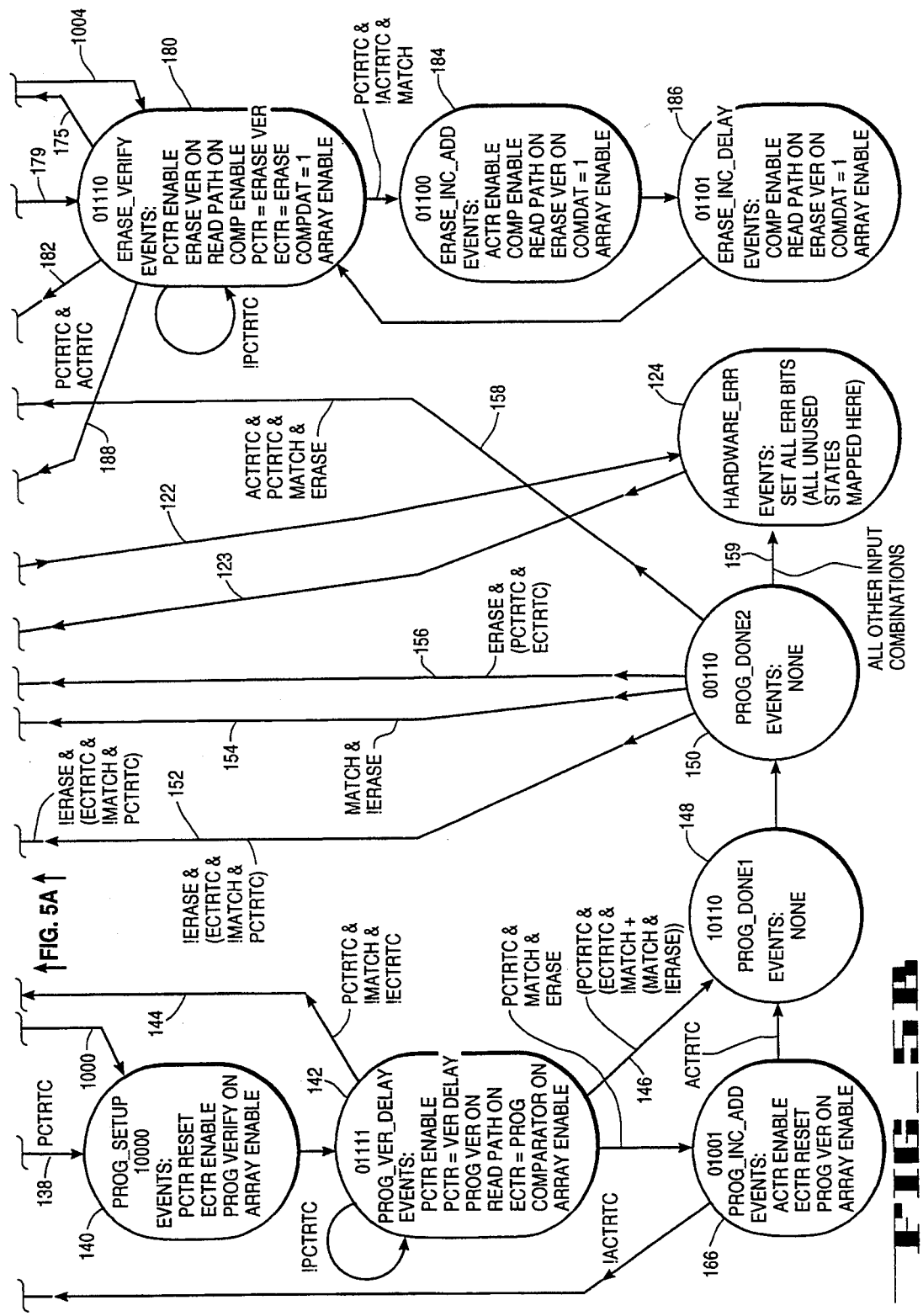

FIG. 6

| SBUS (0:4) | Decoded Signal | State Name |
|---|---|---|

State names (columns, left to right):
POWER_UP, APPLY_ERASE, PROG_FAIL, PROGRAM, PROG_INC_ADD, ERASE_FAIL, ERASE_INC_ADD, ERASE_INC_DELAY, ERASE_VERIFY, PROG_VER_DELAY, PROG_SETUP, PROG_EQ, ERASE_OFF, ERASE_SETUP2, ERASE_IDLE, PROGRAM_DONE1, ERASE_SETUP1, HARDWARE_ERRS SBUS (0:4) values: 00000, 00010, 00101, 01000, 01001, 01011, 01100, 01101, 01110, 01111, 10000, 10001, 10011, 10100, 10110, 10111, 11000, 11001, 11010, 11011, 11100, 11101, 11110, 11111

Decoded signal acronyms (rows): AE, PGVER, ERVER, ERASE, PGM, PGSETUP, ACTREN, ACTRST, PGMFAIL, ERSFAIL, READY, COMPDAT, COMPEN, DE, PCTSELVER, PCTSELPGM, PCTSELRGS, PCTRST, ECTRPG, ECTRER, ECTREN, ECTRST

FIG._7

| SIGNAL ACRONYM | SIGNAL NAME |
|---|---|
| ECTRST | EVENT COUNTER RESET |
| ECTREN | EVENT COUNTER ENABLE |
| ECTRER | EVENT COUNTER TC OUT = ERASE NOMINAL (2000) |
| ECTRPG | EVENT COUNTER TC OUT = PROGRAM NOMINAL (50) |
| PCTRST | PERIOD COUNTER RESET (PCTR RUNS IN ALL STATES RESET IS NOT ASSERTED) |
| PCTSELERS | PERIOD COUNTER TC OUT = ERASE PULSE WIDTH |
| PCTSELPGM | PERIOD COUNTER TC OUT = PROGRAM PULSE WIDTH |
| PCTSELVER | PERIOD COUNTER OUT = 0.5 SECOND ERASE |
| DE | DATA PATH ENABLE (SENSE AMPS/DRAIN BIAS, ETC.) |
| COMPEN | COMPARATOR ENABLED |
| COMPDAT1 | FORCE COMPARATOR DATA TO 1 IF ERASE MODE |
| READY | SET RDY/BSY# = 1 |
| ERSFAIL | SET ERASE FAIL BIT |
| PGMFAIL | SET PROGRAM FAIL BIT |
| ACTRST | ADDRESS COUNTER RESET |
| ACTREN | ADDRESS COUNTER ENABLED FOR COUNTING |
| PGSETUP | PROGRAM SETUP |
| PGM | PROGRAM DATA IN |
| ERASE | APPLY ERASE VOLTAGES |
| ERVER | TURN ERASE VERIFY CIRCUITRY ON |
| PGVER | TURN PROGRAM VERIFY CIRCUITRY ON |
| AE | ENABLE THE ARRAY (X DECODERS, ETC.) |

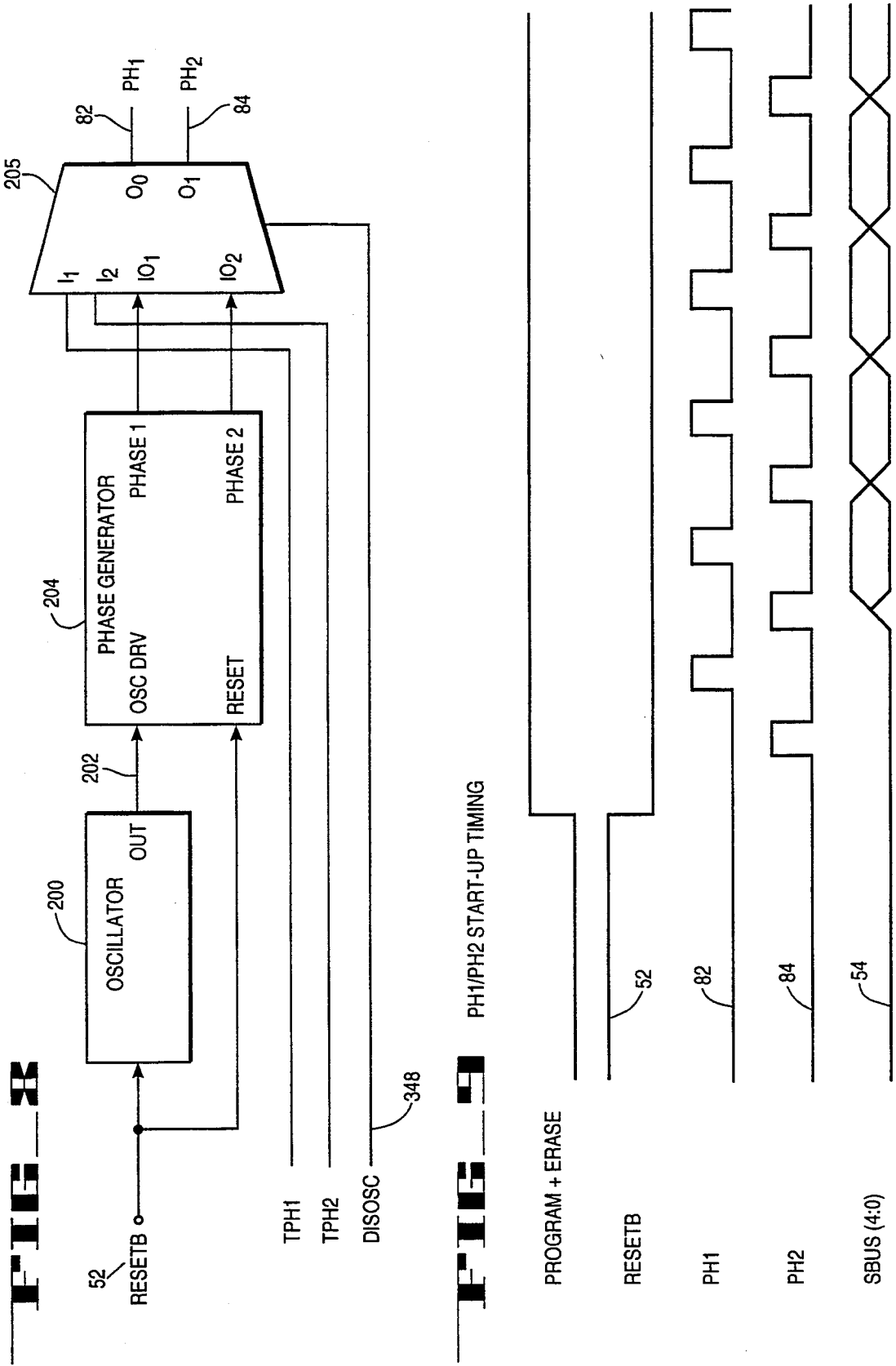

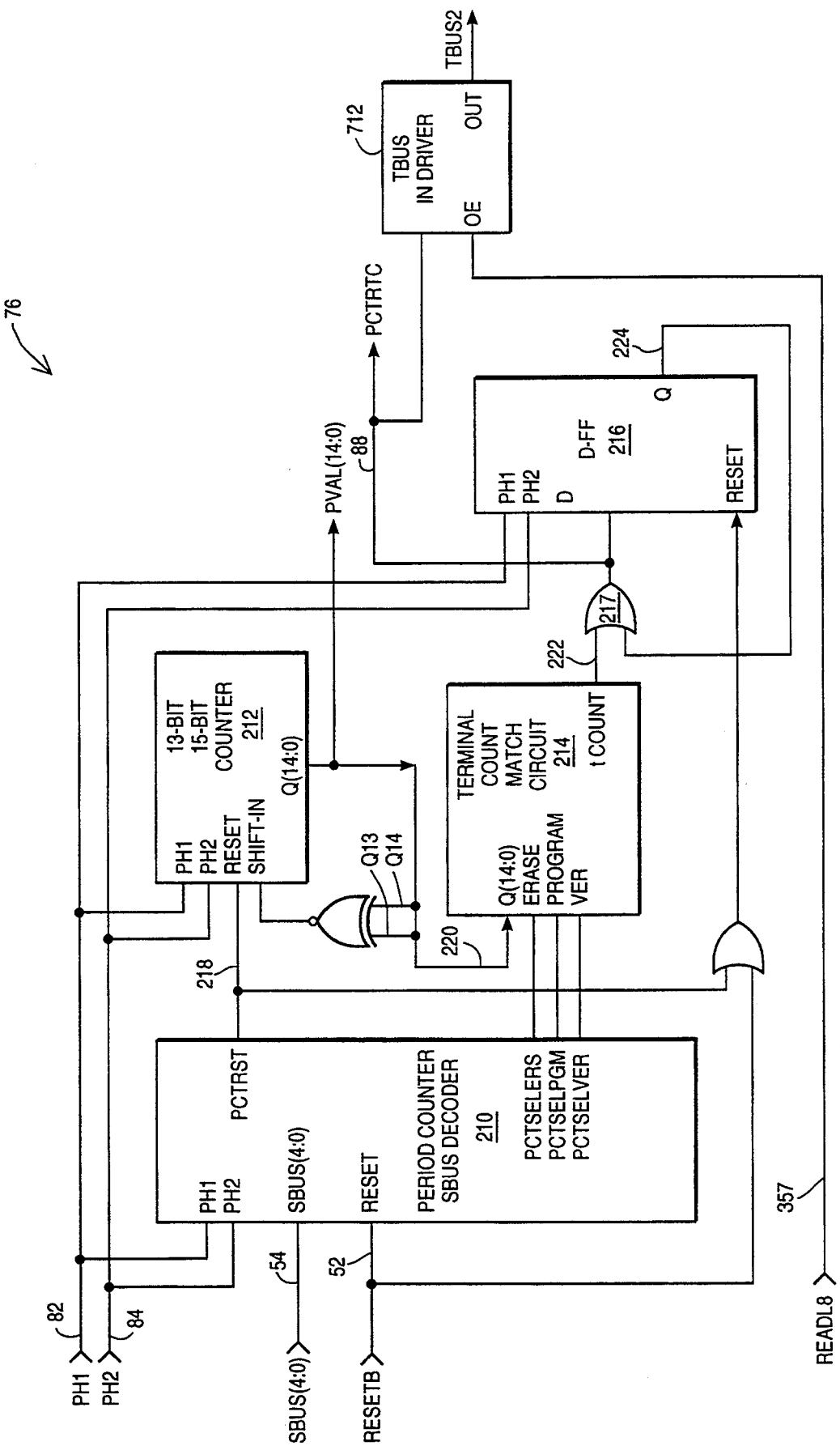
FIG_10

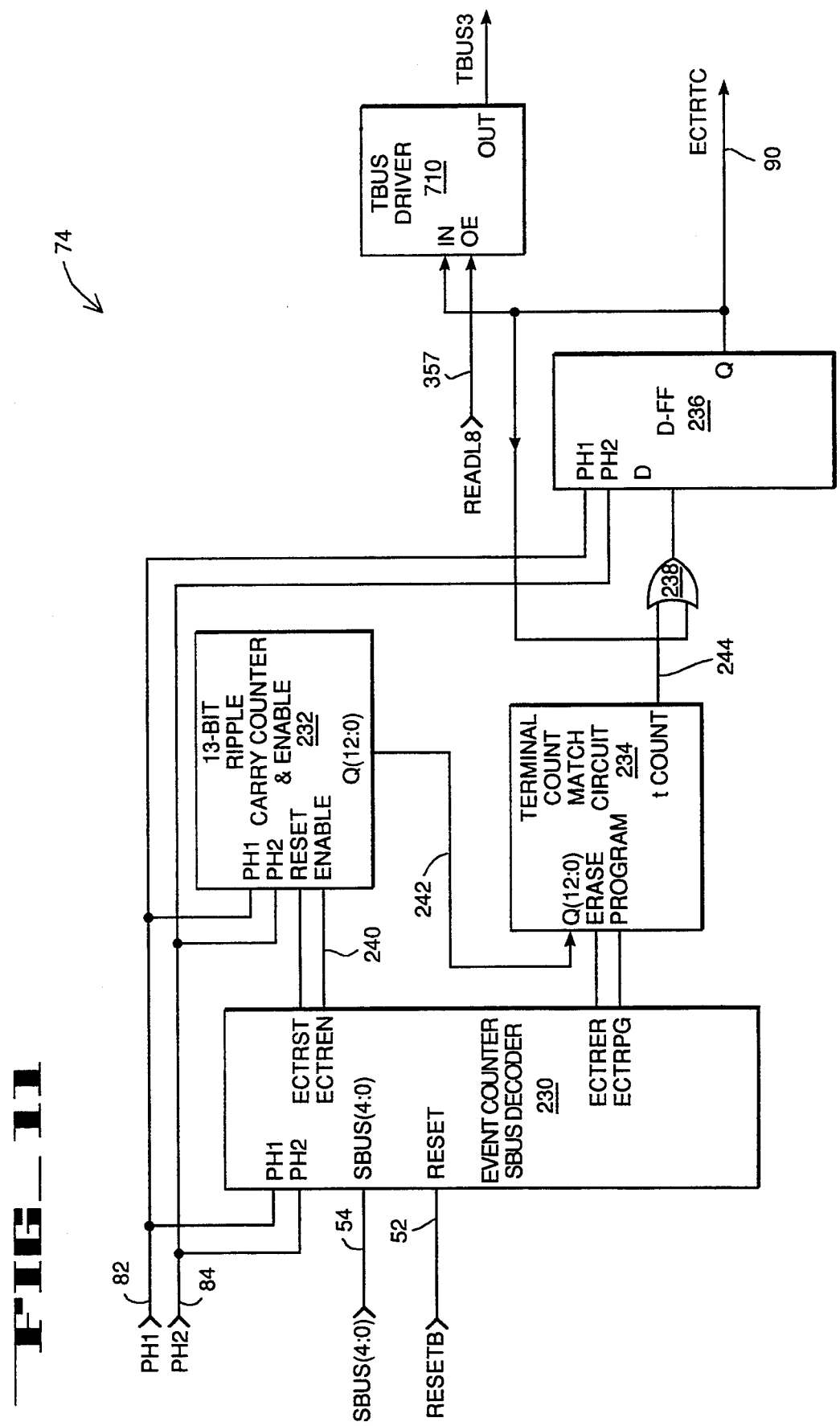

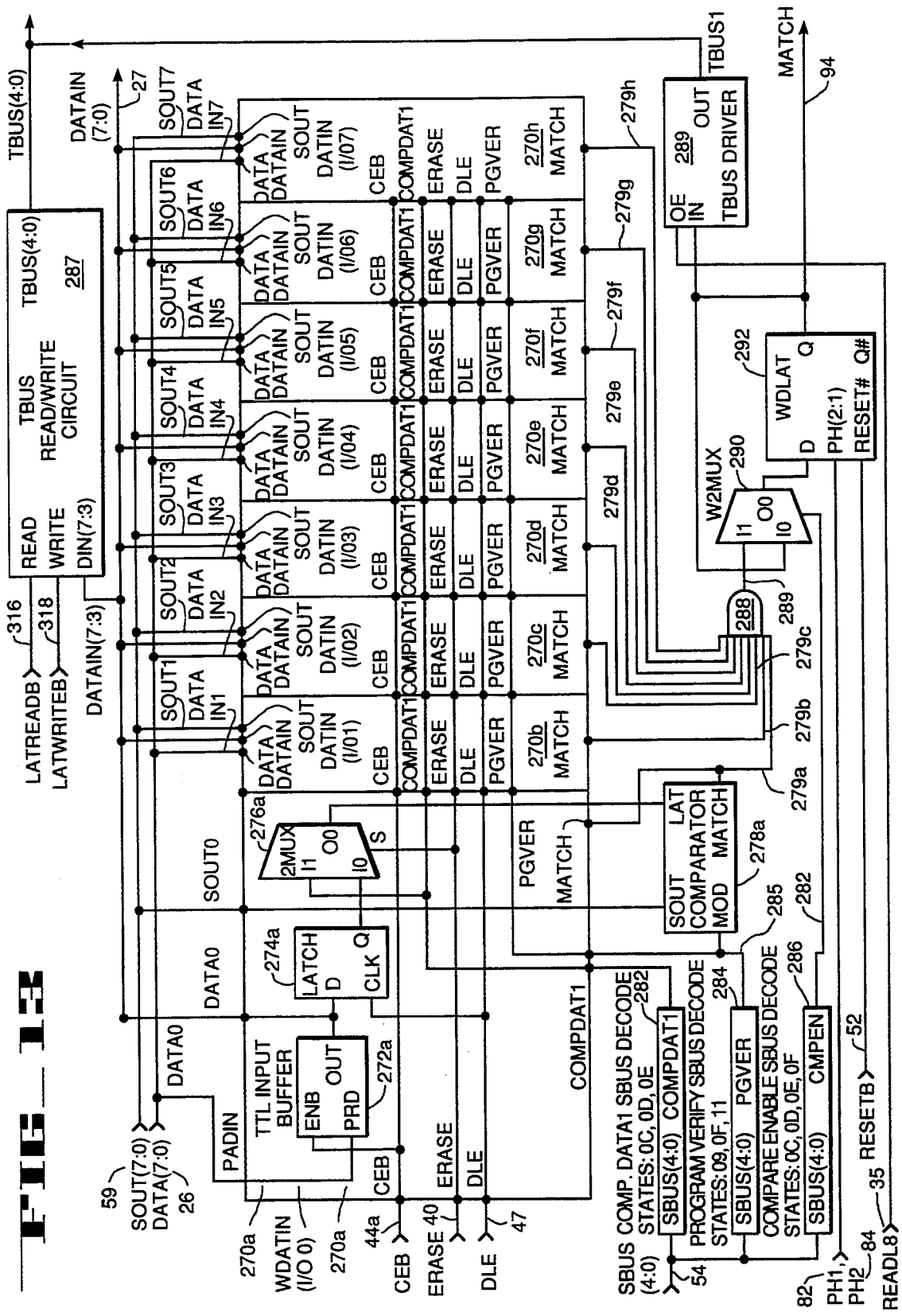
FIG_13

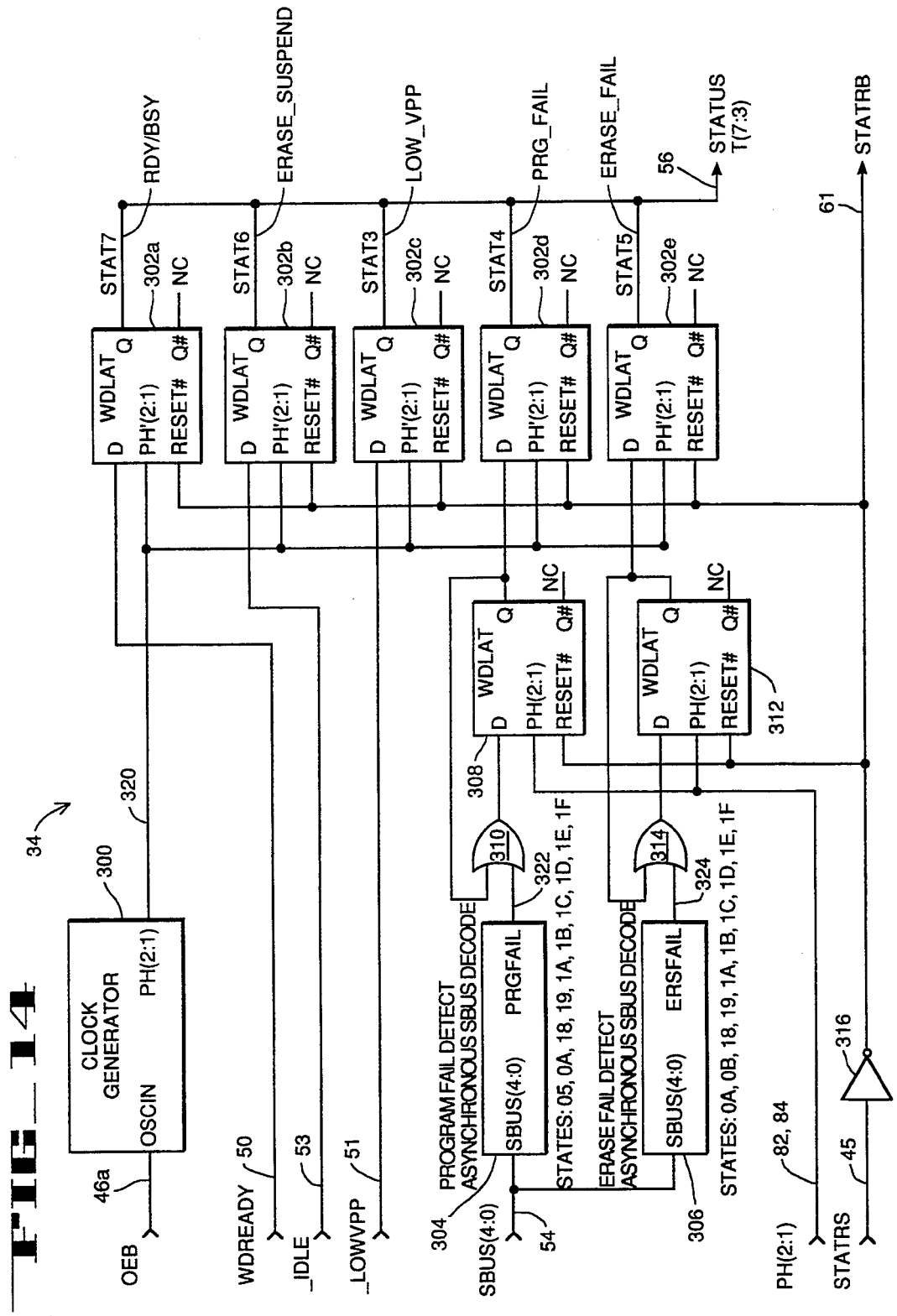
FIG_14

FIG_15

| WSM SIGNALS | TEST REGISTER ADDRESS (APPLIED VIA ADDRESS PINS A(7:4)) | DATA PIN OUTPUT ON |
|---|---|---|
| A(3:0) | 09H | D(6:3) |
| A(7:4) | 0AH | D(6:3) |
| A(11:8) | 0BH | D(6:3) |
| A(16:12) | 0CH | D(7:3) |
| MATCH | 08H | D4 |
| ECTRTC | 08H | D6 |
| PCTRTC | 08H | D5 |
| ACTRTC | 08H | D7 |
| SBUS(4:0) | 0EH | D(7:3) |

FIG_17

| TEST MODE BIT ||||
|---|---|---|---|
| NAME | REGISTER ADDRESS APPLIED VIA A(7:3) | READ/WRITE ON DATA PIN | FUNCTION |
| NST | 07H | D4 | CONNECTS PERIOD COUNTER OUTPUTS TO NEXT STATE LOGIC INPUTS |
| ISOSM | 06H | D3 | ISOLATES NSL FROM WSM |
| DISOSC | 05H | D6 | DISCONNECTS OSCILLATOR |
| RSTOVERIDE | 07H | D5 | OVERRIDES RESET |
| NBL | 04H | D5 | DISABLES ALL BIT LINES |
| GNDSEN | 04H | D7 | GROUNDS SENSE NODES |
| SLFRC | 06H | D6 | SELECTS OUTPUTS FROM TEST REGISTER AS SBUS OUTPUT |
| TDOUT(4:0) | X | D(7:3) | DRIVES SBUS WHEN SLFRC SET |

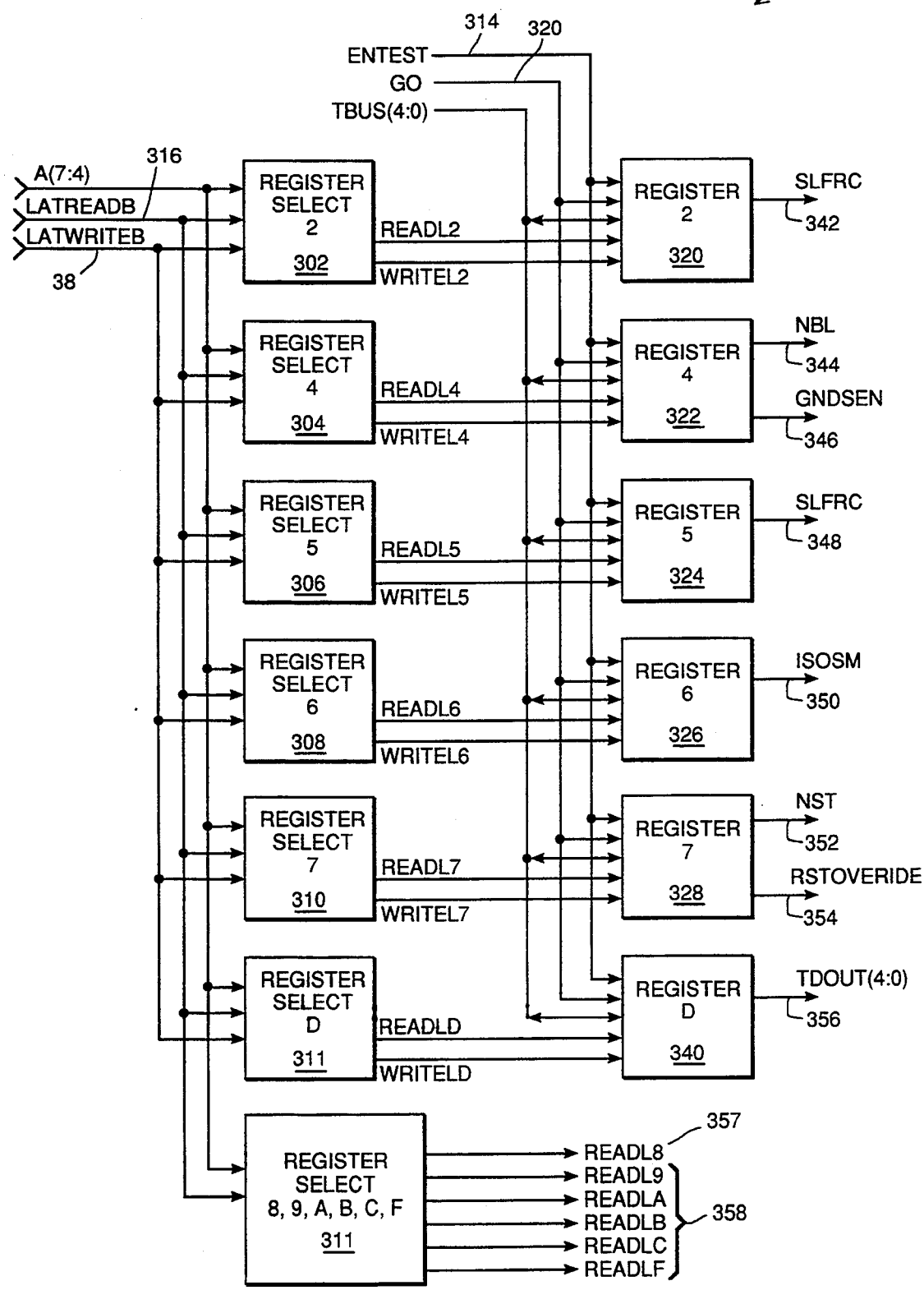

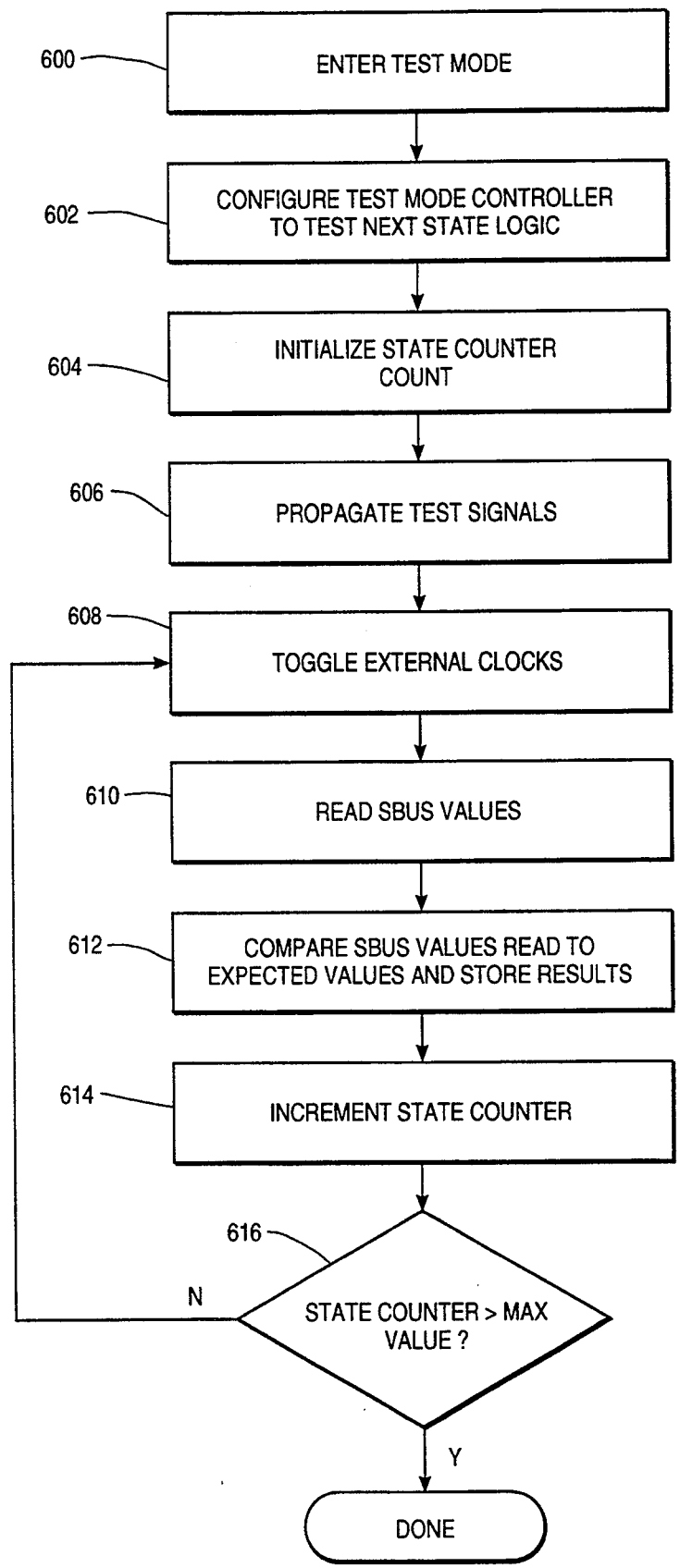

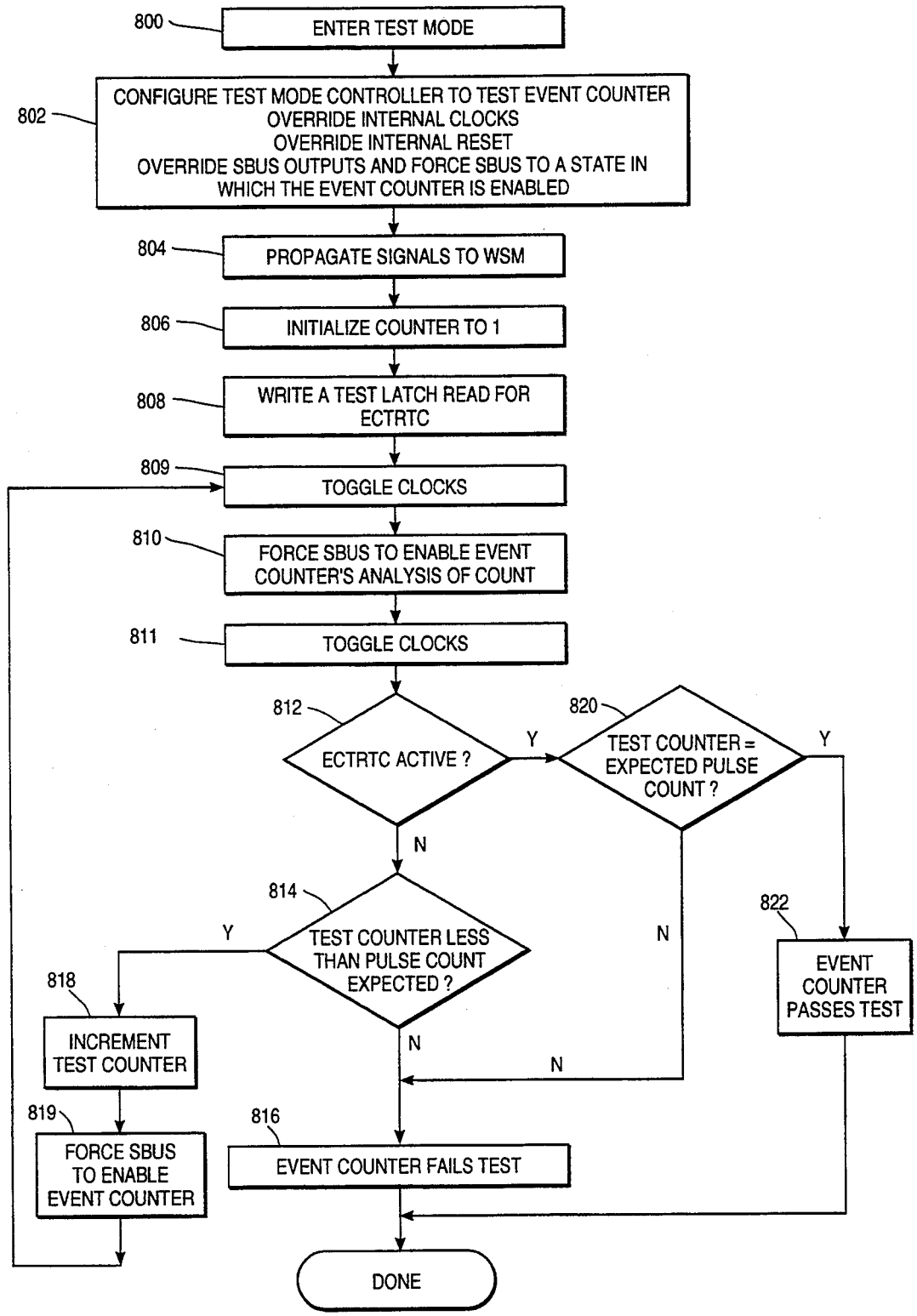

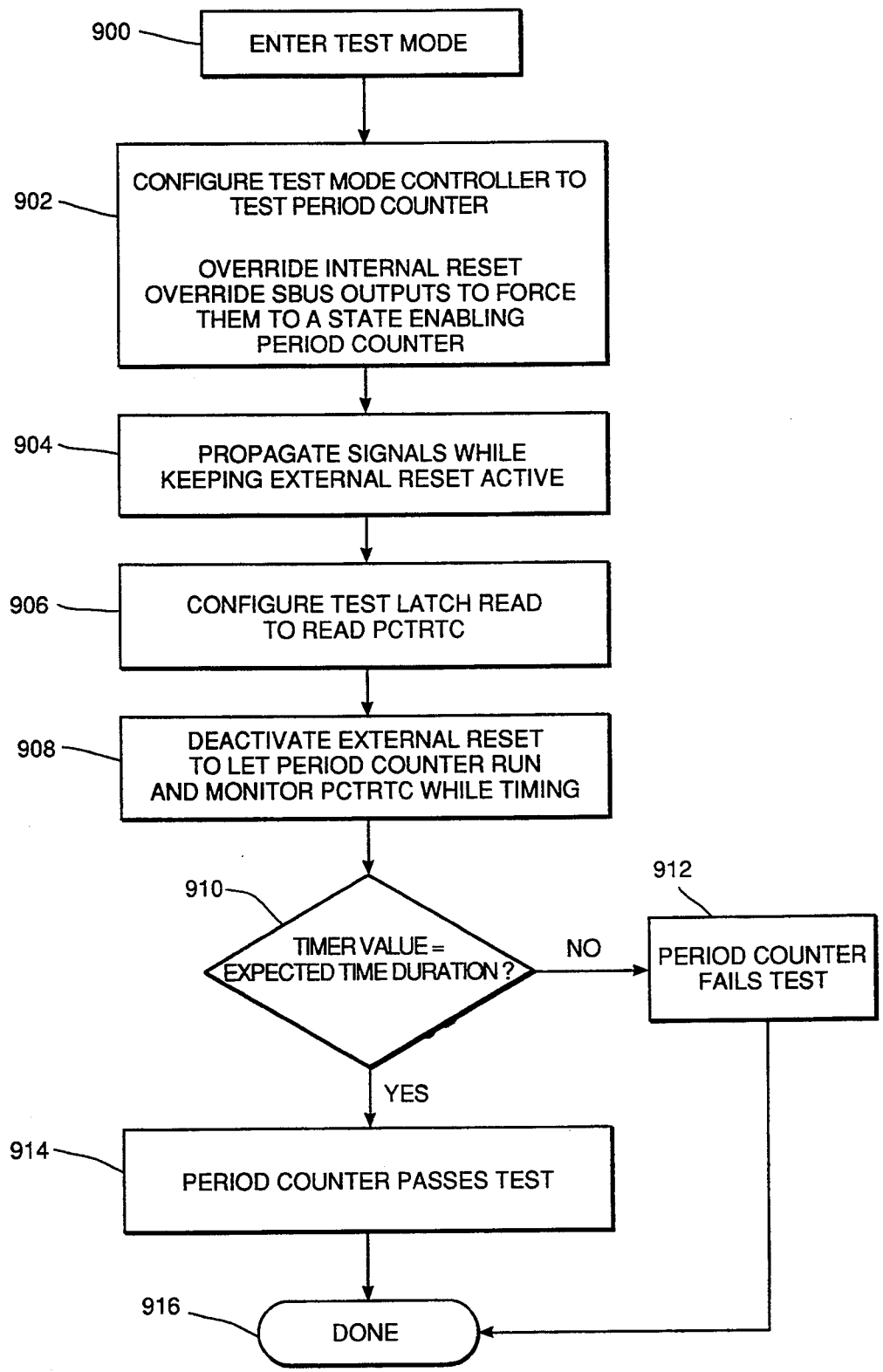

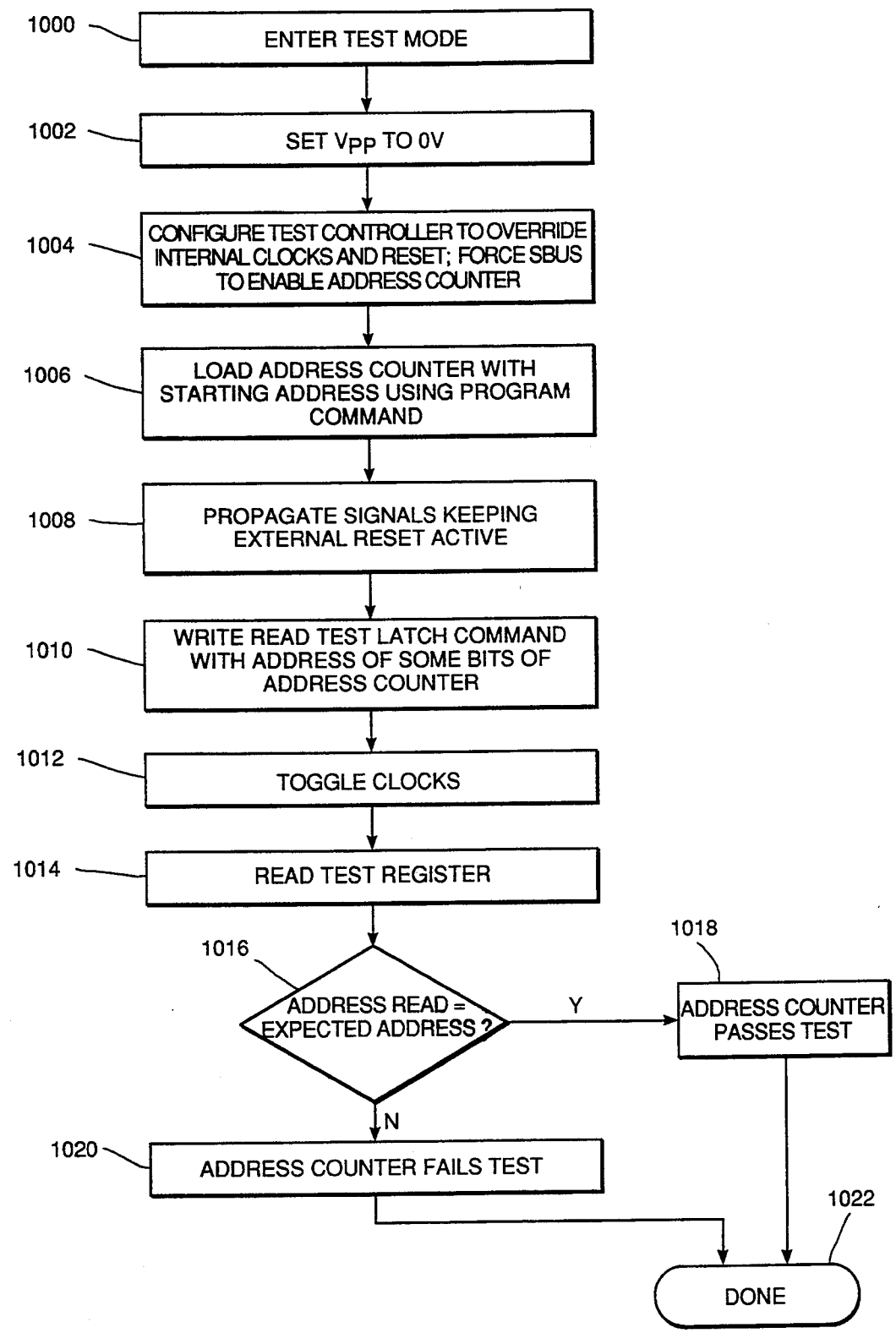

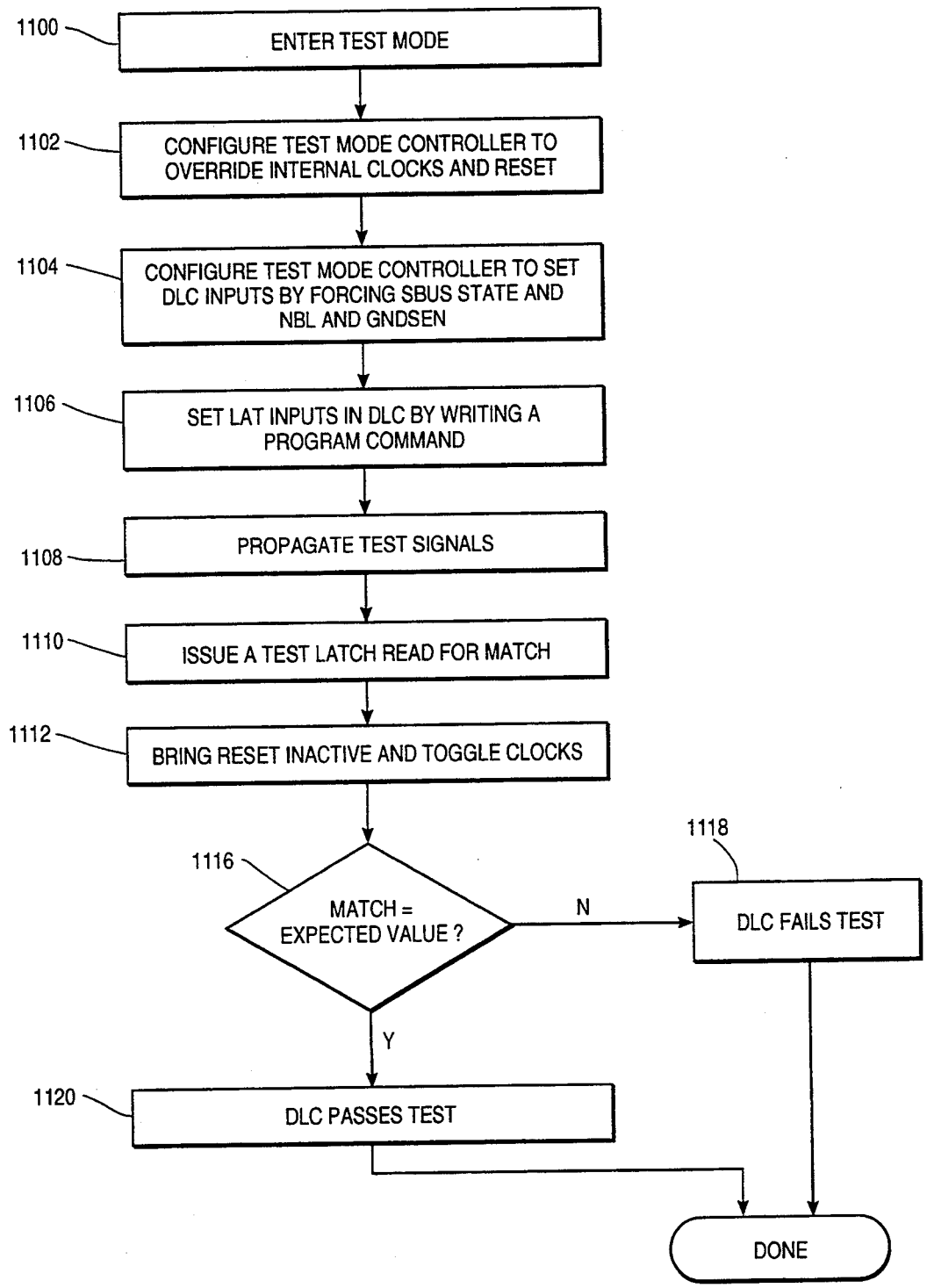

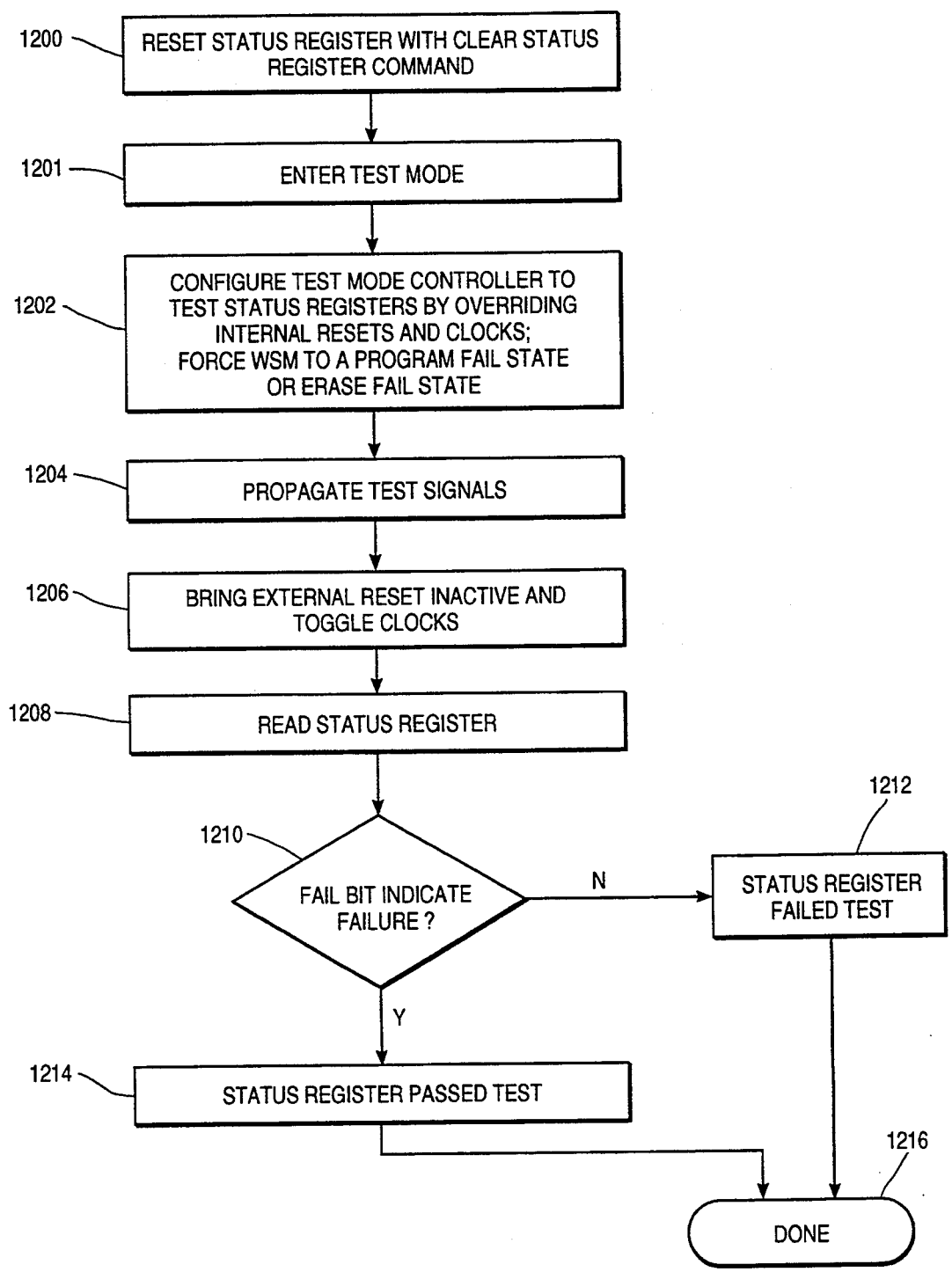

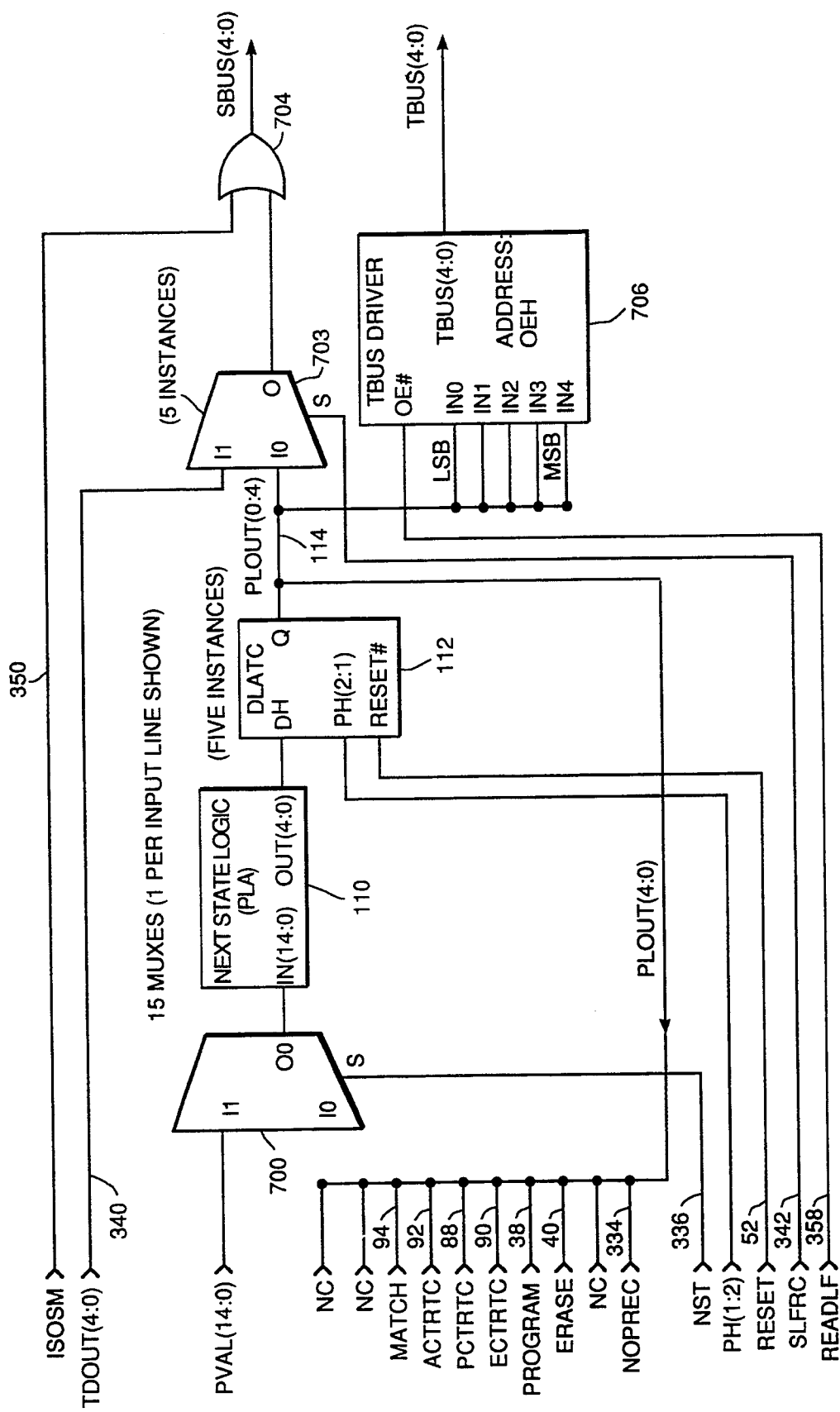
FIG_24

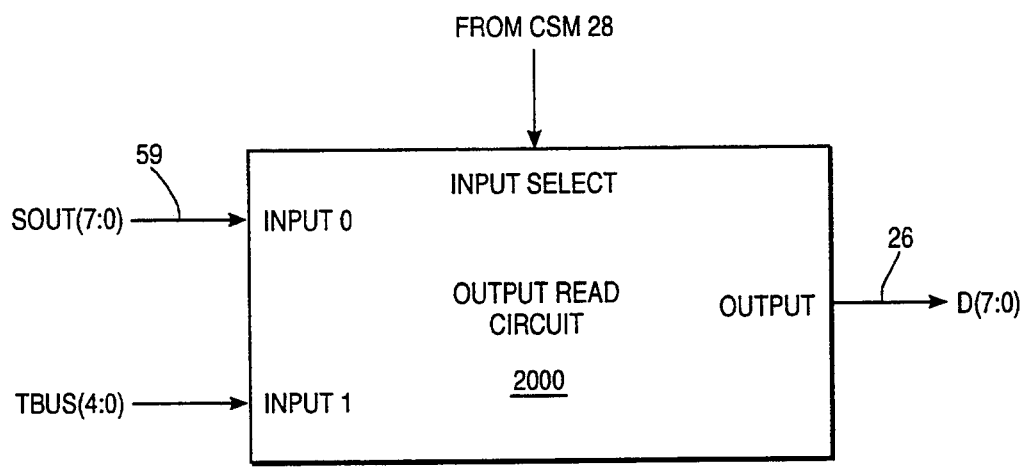
FIG_25

CIRCUITRY AND METHOD FOR TESTING A WRITE STATE MACHINE

RELATED APPLICATION

This application is related to U.S. Ser. No. 07/654,375, filed Feb. 11, 1991. This application is also related to U.S. Pat. application Ser. No. 07/801,953, filed Dec. 3, 1991, and entitled METHOD OF TESTING CHARACTERISTICS OF A FLASH MEMORY ARRAY.

FIELD OF THE INVENTION

The present invention relates to a method of verifying the operation of a write state machine. More particularly, the present invention relates to a method of verifying the operation of individual circuits within a write state machine.

BACKGROUND OF THE INVENTION

One type of prior non-volatile semiconductor memory is the flash electrically erasable programmable read-only memory ("flash EEPROM"). The flash EEPROM can be programmed by a user, and once programmed, the flash EEPROM retains its data until erased. After erasure, the flash EEPROM may be programmed with new code or data.

Flash memories differ from conventional electrically erasable programmable read only memory ("EEPROMs") with respect to erasure. Conventional EEPROMs typically use a select transistor for individual byte erase control. Flash memories, on the other hand, typically achieve much higher density with single transistor cells. For one prior art flash memory erase method, a high voltage is supplied to the sources of every memory cell in a memory array simultaneously. This results in a full array erasure.

For one prior flash EEPROM, a logical "one" means that few if any electrons are stored on a floating gate associated with a bit cell. A logical "zero" means that many electrons are stored on the floating gate associated with the bit cell. Erasure of a prior flash memory causes a logical one to be stored in each bit cell. Each single bit cell of that flash memory cannot be overwritten from a logical zero to a logical one without a prior erasure. Each single bit cell of that flash memory can, however, be overwritten from a logical one to a logical zero, given that this entails simply adding electrons to a floating gate that contains the intrinsic number of electrons associated with the erased state.

One prior flash EEPROM is the 28F256 complementary metal oxide semiconductor ("CMOS") flash memory sold by Intel Corporation of Santa Clara, Calif., which is a 256 kilobit flash EEPROM. The 28F256 flash memory includes a command register to manage electrical erasure and reprogramming. Commands are written to the command register from a controlling microprocessor using standard microprocessor write timings. The command register contents serve as input to an internal state machine that controls erase and programming circuitry.

A controlling microprocessor controls the erasure and programming of the flash memory. A prior Quick-Erase TM algorithm of Intel Corporation can be used by a microprocessor to erase the flash memory. The prior Quick-Erase TM algorithm requires that all bits first be programmed to their charged state, which is data equal to 00 (hexadecimal). Erasure then proceeds by pulling the source of the transistors in the array up to a high voltage level for a period of 10 msec, while keeping the transistor gates at zero volts. After each erase operation, erase verification of each byte is performed. The prior Quick-Erase TM algorithm allows up to 3000 erase operations per byte prior to recognition of erase failure. Proper device operation requires that the erasure procedure be strictly followed.

The prior Quick-Pulse Programming TM algorithm of Intel Corporation can be used by a microprocessor to program the flash memory. The Quick-Pulse Programming TM algorithm requires that a programming pulse of a specific duration and voltage level be applied to the program power supply Vpp and the device power supply Vcc. For example, for certain prior Intel flash memories a programming pulse of 10 $\mu$sec has been suggested while Vpp is held at 12.75. After the programming pulse is applied, the user must verify whether the memory cell addressed is properly programmed. If not properly programmed, a programming pulse may be reapplied a number of times before a programming error is recognized. Intel's Quick-Pulse Programming TM algorithm allows up to 25 programming operations per byte. Proper and reliable operation of the flash memory mandates that the programming procedure be strictly followed.

One disadvantage of the prior way of using a microprocessor to control erasure and programming of the flash memory is that it ties up the microprocessor, thus requiring a relatively high level of microprocessor overhead. This, in turn, decreases system throughput.

Another disadvantage of the prior way of using a controlling microprocessor to control the erasure and programming of the flash memory is the relatively high complexity of typical erasure/programming software. This complex software requires a relatively high level of user sophistication. Moreover, this complex software increases the likelihood of a customer error, such as over-erasure of the flash memory.

SUMMARY AND OBJECTS OF THE INVENTION

A method is described for verifying the operation of next state logic within a write state machine, which automatically programs and erases a flash memory. Verification of the next state logic's operation begins by configuring the wide state machine in a test mode. Afterward, the next state logic is cycled through its possible output states by providing it with all possible input states. Outputs from next state logic are compared to expected outputs, thereby verifying the operation of the next state logic.

Circuitry for verifying the operation of next state logic is also described. The circuitry includes test registers that store programmable test signals. In response to the test signals a first circuit isolates the next state logic from the wide state machine. A second circuit provides alternate inputs to the next state logic in response to the test signals.

Also described are methods and circuitry for verifying the operation of other circuits within the write state machine.

BRIEF DESCRIPTION OF DRAWINGS

The present invention is illustrated by way of example and not limitation in the figures of the accompanying drawings in which like references indicate like elements and in which:

FIG. 1 is a block diagram of circuitry of a flash memory, including a write state machine;

FIG. 2 is a table of flash memory commands;

FIG. 3 is a block diagram of the write state machine;

FIG. 4 is a block diagram of the circuitry of next state controller;

FIG. 5 comprised of FIGS. 5A and 5B, is a state diagram of the method of programming and erasing flash memories;

FIG. 6 is a table of SBUS values for each write state machine state;

FIG. 7 is a table of signal names;

FIG. 8 is a block diagram of the circuitry of the oscillator and phase generator;

FIG. 9 is a start-up timing diagram for PH1 and PH2;

FIG. 10 is a block diagram of the circuitry of the period counter;

FIG. 11 is a block diagram of the circuitry of the event counter;

FIG. 13 is a block diagram of the circuitry of the data latch;

FIG. 14 is a block diagram of the status register;

FIG. 15 is a table of writable test register addresses;

FIG. 16 is a block diagram of the test mode controller;

FIG. 17 is a table of read only test mode bit addresses;

FIG. 18 is a flow diagram of the method of testing the next state logic;

FIG. 19 is a flow diagram of the method of testing the event counter;

FIG. 20 is a flow diagram of the method of testing the period counter;

FIG. 21 is a flow diagram of the method of testing the address counter;

FIG. 22 is a flow diagram of the method of testing the data latch;

FIG. 23 is a flow diagram of the method of testing the status register;

FIG. 24 is a block diagram of a next state controller modified to allow testing of the write state machine;

FIG. 25 is a block diagram of the Output Read Circuit.

DETAILED DESCRIPTION

Figure 12:
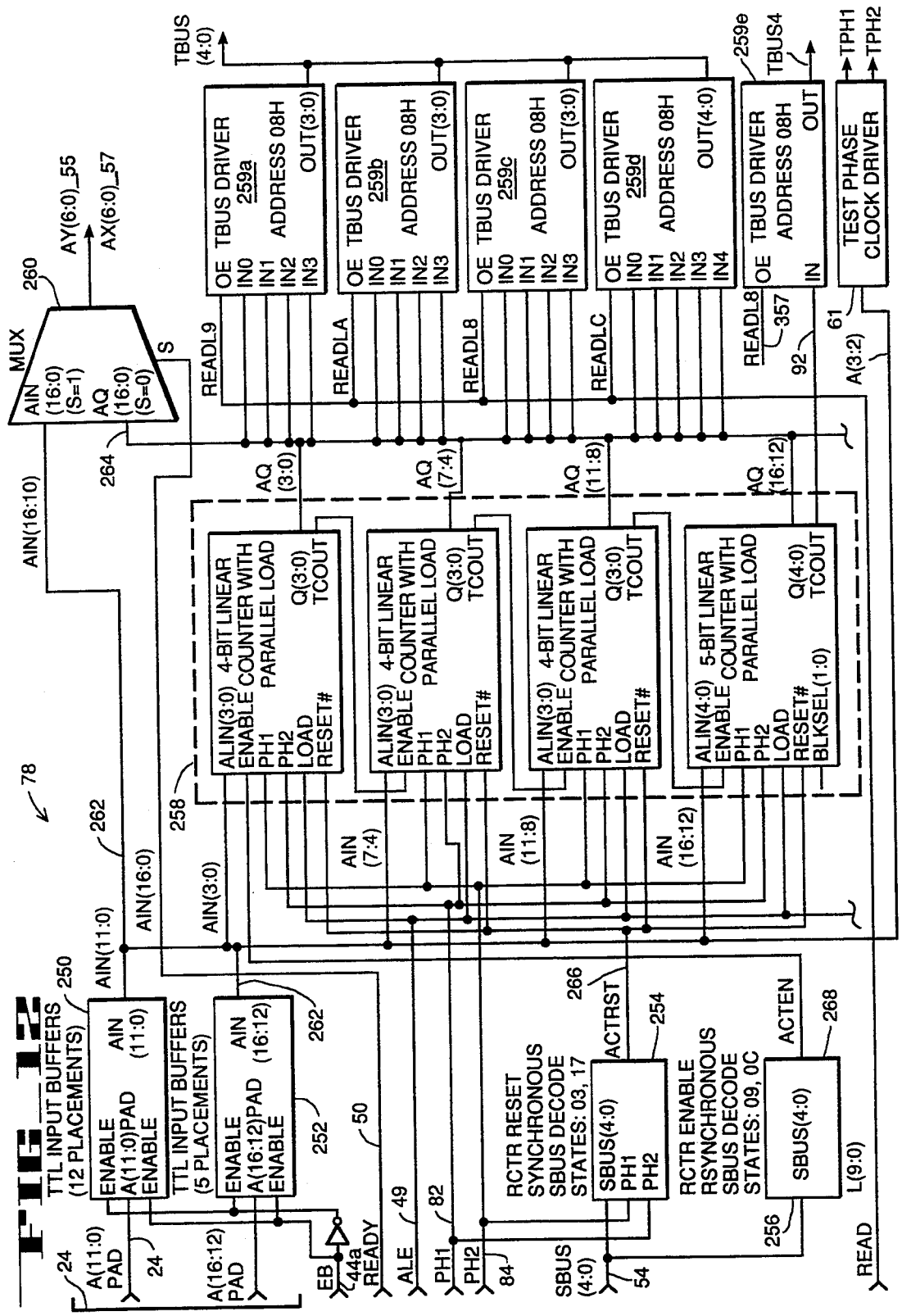
FIG. 12 is a block diagram of the circuitry of the address counter.

A write state machine on-board a flash memory controls programming and erasure of the memory array. The proper operation of the write state machine is essential to the operation of each flash memory. Accordingly, the present invention provides a method of testing the functionality of the write state machine. The present invention includes modifications to the write state machine that allow each major circuit within the write state machine to be tested separately.

Knowledge of the write state machine ("WSM"), which automatically programs and erases the flash memory array, is helpful to an understanding of the present invention. Thus, the write state machine is described in detail in Section I. Throughout Section I little mention is made of those modifications to the write state machine used to test its operability, even though these modifications are illustrated in the referenced drawings. The modifications will be explained in Section II.

SIGNAL CONVENTIONS

In this application, signals will be generally referred to by signal names. Particular signal names may be varied without departure from the scope and spirit of the present invention. Further, signal states will be referred to as being active or inactive, or as being high or low, one or zero, etc. Signals which are active when low are indicated by a "B" suffix (XXXB). As examples of this signal naming convention, see the table below:

| SIGNAL NAME | ELECTRICAL NOTATION | LOGICAL NOTATION | STATE |
|---|---|---|---|
| SBUS3 | High | 1 or true | Active |
|  | Low | 0 of false | Inactive |
| CEB | Low | 0 or false | Active |
|  | High | 1 or true | Inactive |

In describing groups of signals a decimal radix convention may be used, such as using TDOUT(4:0) to refer to all 5 data lines of a bus. Within each group, the least significant bit of the group is referred to with a suffix of "0". In other words, TDOUT0 refers to the least significant data line of the bus and TDOUT4 refers to the most significant data line.

I. NORMAL OPERATION OF THE WRITE STATE MACHINE

FIG. 1 illustrates in block diagram form the circuitry of flash EPROM 20, which is a preferred embodiment of the present invention. Flash EPROM 20 is also referred to as flash memory 20.

As described in more detail below, flash EPROM 20 includes write state circuitry 32. Write state circuitry 32 sequences the nonvolatile semiconductor memory 20 through multi-step sequences to program or erase memory contents as desired with only an initiating command from microprocessor 999. Once a program or erase sequence is initiated, write state machine 32 controls programming and erasure. Status register 34 indicates to the microprocessor 999 when program and erase operations have been completed.

Vpp 36 is the erase/program power supply voltage for the flash memory. Vcc is the device power supply for flash memory 20 and Vss is ground. In one embodiment, Vpp 36 is 12.0 volts and Vcc is approximately 5 volts.

In the absence of high voltage on Vpp 36, flash memory 20 acts as a read-only memory. The data stored at an address supplied via lines 24 is read from memory array 22 and made available via data input/output lines 26 to the circuitry external to the flash memory 20.

Flash memory 20 has three control signals: chip-enable bar CEB 44, WEB 46, and output-enable bar OEB 42. The chip-enable bar CEB 44 input is the power control and is used to select flash memory 20. CEB 44 is active low. The output-enable bar input OEB 42 is the output control for flash memory 20 and is used to gate data from the output pins from flash memory 20. OEB 42 is active low. Both control signals CEB 44 and OEB 42 must be logically active to obtain data at the data lines 26 of flash memory 20.

The write enable bar signal, WEB 46, allows writes to command state machine 28 while CEB 44 is low. Write enable bar signal 46 is active low. Addresses and data are latched on the rising edge of WEB 46. Standard microprocessor timings are used.

Device operations are selected by writing specific data patterns into the flash memory via data input/output lines 26. FIG. 2 defines certain commands.

SRD in FIG. 2 represents data read from the status register 34. PA in FIG. 2 represents the address of the memory location to be programmed and PD represents the data to be programmed at address PA.

Erase is executed on an entire array 22 of FIG. 1 and initiated by a two-cycle command sequence. An erase-setup command is first written, followed by the erase-confirm command. Array preconditioning, erase and erase verification are all handled internally by the write state machine, invisible to the microprocessor 999. The erase operation takes approximately 1 second.

This two step erase, set-up followed by execution, ensures that memory contents are not accidentally erased. Erasure can occur only when high voltage is applied to Vpp. In the absence of this high voltage, the memory contents are protected against erasure.

The erase event involves two major tasks: preconditioning and erasing. Preconditioning the array 22 by bringing cell voltages to approximately 6.75 volts protects the longevity of the array 22 by preventing cell voltages during erasure from dropping to levels that could result in cell leakage. Array erasure brings cell voltages to approximately 3.25 volts, a logic 1.

The microprocessor 999 can detect the completion of the erase event by issuing a Read Status Register command and analyzing the status data. When the status register 34 indicates that erase is complete, the erase failure status bit should be checked. After examination the status register 34 error bits should be cleared as appropriate. Further operation can occur only after giving the appropriate command.

Programming is also executed by a two-cycle command sequence. The Program Set-up command is written to the command state machine 28 via data lines 26, followed by a second wide command specifying the address and data to be programmed. The write state machine 32 then takes over, controlling the program and verify algorithms internally. Polling the status register 34 with the Status Register Read command will determine when the programming sequence is complete. Only the Read Status Register command is valid while programming is active.

When the status register 34 indicates that programming is complete, the program fail bit should be checked. After examination, the microprocessor 999 should clear the status register error bits as appropriate.

in a preferred embodiment, the circuitry of flash memory 20 shown in FIG. 1 is on a single substrate. In a preferred embodiment, flash memory 20 employs CMOS circuitry.

Flash memory 20 includes a memory array 22, which includes memory cells that store data at addresses. In addition, flash memory 20 includes on-chip command state machine ("CSM") 28, synchronizer 30, write state machine ("WSM") 32 and status register 34.

Commands to program or erase memory array 22 are applied via data lines 26. The data on lines 26 is passed on to command state machine 28. The command state machine 28 decodes the data and if it represents an erase, program or status register reset command, the CSM 28 begins generating the appropriate control signals. The control signals provided by the command state machine 28 to the write state machine 32 include PROGRAM 38, ERASE 40, status register reset signal STATRS 45, address latch enable ALE 49, and data latch enable signal DLE 47.

The program and erase algorithms are regulated by the write state machine 32, including program pulse repetition where required and internal verification of data, as will be discussed in detail herein below.

Write state machine 32 latches in the necessary address and data needed to complete erase and program operations from inputs A(16:0) 24 and D(7:0) 26. The operation of the write state machine's address and data latches is controlled respectively by address latch enable signal ALE 49 and data latch enable signal DLE 47 from the CSM 28.

The write state machine 32 interfaces with memory array 22 via array address signals AY 55 and AX 57 and sense amp outputs SOUT(7:0) 59, which represent the data stored at the addressed memory location.

Write state machine 32 reports its status during operation to synchronizer 30 and status register 34 via SBUS (4:0) outputs 54.

The synchronizer 30 provides synchronization between the write state machine 32 and the command state machine 28. Upon receipt of either an active ERASE 38 or PROGRAM 40 signal, synchronizer 30 forces the READY signal 50 to a logic low, indicating to the command state machine 28 and the status register 34 that the write state machine 32 is busy. When the write state machine 32 completes its operation, synchronizer 30 shuts down the write state machine 32 by setting READY.

The synchronizer 30 resets the write state machine 32 whenever ERASE 38 and PROGRAM 40 go to a logic low by forcing RESET signal 52 to a logic high.

The synchronizer 30 also reports to the status register, providing information about the status of write state machine 32 operation via signals LOWVPP 51.

The status register 34 decodes the SBUS (4:0) outputs 54 and indicates to the microprocessor 999 whether the task is complete or not and its success via STATUS outputs 56. STATUS outputs 56 are multiplexed onto the input/output data lines 26.

Test mode controller 29 will be discussed in detail in Section II. Test mode controller does not affect normal programming and erasure.

FIG. 3 illustrates in block diagram form the circuitry of write state machine 32 and its connection to the status register 34. The write state machine 32 includes an oscillator and generator 70, a next state controller 72, an event counter 74, a period counter 76, an address counter 78 and a data latch and comparator ("DLC") 80.

RESETB 52 is applied to nearly all circuits within the write state machine 32. RESETB 52 forces critical nodes within the write state machine 32 to known states. For example, RESETB 52 forces to a logic zero the terminal count signals 88, 90 and 92.

Shortly after receiving an inactive RESET signal 52, the oscillator/phase generator 70 begins generating two non-overlapping phase clocks, phase 1 PH18 2 and phase 2 PH284, which are routed to nearly all of the WSM 32 circuitry. PH284 is the first clock active after RESETB 52.

Next state controller 72 controls and coordinates the activities of the write state machine 32 and determines the WSM's next state. Next state controller 72 generates the five outputs SBUS(4:0) 54, which indicate the WSM's current state.

Next state controller 72 receives a number of test mode inputs, NOPREC, NST, ISOSM and PVAL(14:0), which do not affect normal programming and erasure while they are inactive. The behavior of next state controller 72 in response to these signals will be discussed in Section II. Similarly, other test mode inputs to the remainder of the WSM will be discussed in Section II.

Each circuit receiving SBUS (4:0) 54 from the next state controller 72 performs its own SBUS (4:0) 54 decode to determine its next task. This design allows many tasks to be performed in parallel, minimizing the time needed it takes to perform erase and program functions.

The period counter 76 determines and times the pulse periods for array voltages during program and erase operations. Another period indicated by period counter 76 is the delay between programming or erasing and verification of valid data from memory cells. By going active-high, the period counter's 76 terminal count signal PCTRTC 88 informs the next state controller 72 that the selected period of time has elapsed.

The period counter 76 decodes SBUS (4:0) 54 to select the desired pulse period. SBUS (4:0) outputs 54 also cause the period counter 76 to reset its count one state before period counter 76 is to be enabled.

The event counter 74 determines when the maximum number of program or erase pulses per operation has been reached. When the maximum number of pulses per operation per byte has been reached, the event counters 74 informs the next state controller 72 by bringing the event terminal count signal ECTRTC 90 to a logic high. The event counter 74 determines the maximum number of pulses per operation by decoding the SBUS (4:0) outputs 54. In the preferred embodiment, the maximum number of pulses per program operation per byte is set to 50 and the maximum number of pulses per erase operation is set to 8192.

Within WSM 32, the address counter 78 functions as both an input buffer and a counter. When READY 50 is high the address at address lines A(16:0) is output as signals AY (6:0) 55 and AX (9:0) 57. Signals AY 55 and AX 57 point to the location of the byte in memory array 22 which is to be programmed, erased or read.

After the address has been input to the input buffers, the address from the input buffers will be loaded into the address counter 78 under the control of CSM 28 via the signal ALE 49. The address counter 78 then counts through all the addresses in the memory array 20. The address counter 78 indicates to the next state controller 72 that the end of memory has been reached by forcing its terminal count signal ACTRTC 92 to a logic one.

The data latch and comparator (DLC) 80 is the interface between the WSM 32 and the command state machine 28, and memory array 22 and data lines 26. TTL data input on data lines 26 is buffered by the DLC 80 and passed on to the command state machine 28 as DATAIN(7:0) signals 27.

If the signal received on DATAIN (7:0) lines 27 represents a program command, the command state machine 28 will direct DLC 80 to store the information at data lines 26 by setting the data latch enable signal DLE 47 to a logic one. During the program operation, the DLC 80 compares the data stored in its latches to sense amp signals SOUT (7:0) 59 and indicates a match by setting MATCH 94 to a logic high.

The DLC 80 compares the sense amp signals, SOUT (7:0) 59, which are indicative of memory cell contents, to a reference logic level during erase verify procedures and indicates successful erasure to next state controller 72 by setting MATCH 94 to a logic high.

The status register 34 reports the status of the write state machine 32 to the microprocessor 999 via status signals STATUS (7:3) 56, which are multiplexed onto data input/output lines 26. The status register 34 determines the write state machine's status based upon the signals READY 50, LOWVPP51, and SBUS(4:0) 54.

FIG. 4 illustrates in block diagram form the circuitry of next state controller 72. Next state controller 72 includes next state logic 110 and a master slave D-latch 112. In the preferred embodiment, the next state logic 110 is implemented as a programmable logic array.

Next state logic 110 determines the next state of each circuit within the write state machine 32 based upon the write state machine's previous state, as represented by signals PLOUT(4:0) 114, the terminal count signals, PCTRTC 88, ECTRC 90 and ACTRC 92, MATCH 94, PROGRAM 38 and ERASE 40. Each circuit providing an input to the next state logic 10 does so by the next active PH2 84 following the SBUS(4:0) 54 active. They are able to do so because all circuits within the the wide state machine 32 are master/slave with the output valid on PH2 84.

The output of next state logic 110 is latched into latch 112 and provided to the rest of the write state machine circuitry as SBUS(4:0) 54.

Status bus outputs SBUS(4:0) 54 become active on the second PH2 84 rising edge after RESETB 52 is cleared. As a result of SBUS (4:0) 54 being PH284 active, each WSM 32 circuit evaluates SBUS (4:0) 54 while PH182 is high.

The method of programming and erasing implemented by next state controller 72 can be understood with reference to the state diagram of FIG. 5.

In FIG. 5, each bubble represents a state of write state machine 32. The name of each state is indicated on the top line of each bubble. The unique SBUS (4:0) 54 value for each state is indicated below the state name. The signals which are selected or enabled during each state are listed below the SBUS values. The combination of signals that cause the next state controller 72 to branch to another state are generally indicated in text beside each branch, with inactive signals preceded by an exclamation point "!". It will be understood that next state controller 72 branches from one state to another state regardless of the inputs to next state controller 72 when no combination of signals is indicated next to a branch.

Branches not mentioned in the following discussion, i.e. branches 1000, 1001, and 1004 relate to test modes and will be discussed later in Section II.

When power is first applied to flash memory 20, the next state controller 72 is held in the POWER—UP state 120 by RESETB 52. No events occur in this state, and the next state controller 72 simply begins execution after an active PROGRAM 38 or ERASE 40 is received from the command state machine 28.

Assume that after power-up, next state controller 72 receives an active PROGRAM 38 signal and an active ERASE 40 signal, as indicated by branch 122. These input signals cause the next state controller 72 to branch to the HARDWARE—ERR state 124.

In the HARDWARE—ERR state 124, the status register's 34 two fail bits, PRG—ERR and ERASE—ERR are set to a logic high, indicating a hardware failure. From state 124, the write state machine 32 branches back to the POWER-UP state 120, regardless of the input signals to next state controller 72.

Assume that after entering state 120, the next state controller 72 receives an active PROGRAM signal 38 and an inactive ERASE signal 40, This combination of signals initiates a program event, which will be performed on the byte indicated by address lines 24. The indicated byte will be programmed substantially to the value indicated on the data lines 26. In this situation, the next state controller 72 takes branch 126 to the PROG_SETUP state 132.

In the PROG_SETUP state 132, the next state machine 72 is configured for a program event. In state 132 the period counter 76 is reset and the event counter's 74 program count is selected. The program path in memory array 22 is set-up. Afterwards, the next state controller 72 takes branch 134 to the PROGRAM state 136.

In state 136, the byte indicated by the signals AY 55 and AX 57 is programmed to a voltage level of approximately 6.75 volts, a logic 0. During state 136, the period counter 76 is configured for a program operation by selecting its program period. The write state machine 32 remains in state 136 until the period counter 72 reaches its terminal count, indicating that the program voltage has been applied for a sufficient period of time to bring the byte voltages to 6.75 volts.

The next state controller 72 takes branch 138 to the program equalization state PROG_EQ 140 when PCTRTC 88 becomes active, a logic high.

Events during state 140 prepare the write state machine 32 and the array to perform program verification, i.e. to determine whether the previous program operation was successful. In state 140 the period counter 76 is reset and the event counter 74 is enabled, allowing it to increment its count. The array 22 is enabled, allowing a byte to be read, and the program verify circuitry within the array 22 is turned on.

Now partially configured to perform program verification, next state controller 72 branches from state 140 to the PROG-VER-DELAY state 142. In state 142, the write state machine 32 verifies that the addressed byte has been successfully programmed by comparing the signal SOUT(7:0) to the program data stored in the DLC 80. The period counter 76 provides a verification delay to ensure that SOUT(7:0) 59 is valid before verification is performed.

The array 22 is configured for program verification by enabling the word lines and turning the read path on. The DLC 80 is configured to perform program verification by bringing the signal CMPEN 287 active and bringing the signal PGVER 285 active. When active, the PGVER signal 285 allows the DLC 80 to indicate a match even when the microprocessor 999 has attempted to erase a programmed bit during a program operation. The effect of CMPEN 287 and PRGVER 285 will be discussed in more detail below with respect to the DLC 80 block diagram of FIG. 13.

During state 142, the program count of the event counter 74 remains selected, maintaining the event counter in the program event mode.

When PCTRTC 88 becomes active, the next state controller 72 examines MATCH 94 to determine whether the addressed byte has been successfully programmed. MATCH 94 will be a logic 1 if the byte has been successfully programmed and a logic 0 if it has not.

Given that the microprocessor 999 requested a program operation, the next state controller 72 can take only two of the three branches out of state 142.

Next state controller 72 takes branch 144 back to the PROGRAM-SETUP state 132 if the previous program operation was not successful and the event counter 74 has not exceeded the maximum program event count. The write state machine 32 cycles through states 132, 136, 140, and 142 until the byte is successfully programmed or the event counter 74 times out, whichever occurs first.

When the event counter 74 times out or the byte has been successfully programmed, next state controller 72 takes branch 146 to the first program done state PROG-DONE 1148. No events occur in state 148.

The next state controller 72 branches to the PROG_DONE2 state 150 from state 148. Again, no events occur.

During a program event next state controller 72 can only take three branches 152, 154, or 159 out of state 150.

Next state controller 72 takes branch 159 to state 124 when the next state controller 72 receives any illegal SBUS state assignment. In the HARDWARE_ERR state 159 both the PRG_ERR and ERASE_ERR bits of the status register are set. The next state logic 72 thereafter branches to state 120 from state 159 and the program event ends in a hardware failure.

FIG. 6 includes SBUS values for states that are mapped as hardware errors. FIG. 7 gives the names for the signal acronyms used in FIG. 6.

If the program operation has failed the next state controller 72 takes branch 152 to the PRG_FAIL state 160 from state 150. In the PROG-FAIL state 160 the status register's 34 program fail bit PRG_ERR is set. Afterward, next state controller 72 branches back to the POWER-UP state 120. Again the program event ends as a failure.

If, on the other hand, the program operation has been successful, then next state controller 72 takes branch 154 directly to state 120 from state 150. In this instance the program event is successfully completed.

The erasing of memory array 22 is initiated by receipt of an active ERASE signal 38 and an inactive PROGRAM signal 40 while in the POWER_UP state 120. This combination of signals initiates an erase event and causes next state controller 72 to take branch 162 to the ERASE state 164.

In ERASE state 164 next state controller 72 initializes the write state machine 32 for array preconditioning by resetting the address, period, and event counters 78, 76, and 74.

From ERASE state 160 next state controller 72 branches to state 132 and begins array 22 preconditioning; i.e. programming each bit, to a logic 0 prior to erasing the array.

During an erase operation next state controller 72 will cycle through states 132, 136 and 140 as described herein above with respect to program operations.

Differences between erase and program operations appear in the possible branches out of the PROG_VER_DELAY state 142. These differences occur, in part, because programming occurs a byte at a time while erasure occurs for the entire array 22. The additional possible states in an erase event cycle the address counter through each byte in the array 22.

Next state controller 72 branches to the PROG_INC_ADD state 166 from state 142 if the addressed byte has been successfully preconditioned. In the PROG_INC_ADD state 166 events prepare the write state machine 32 to precondition another byte of memory. Address counter 78 is enabled, allowing its count to be incremented, thereby pointing to a new address within the array 22. The event counter 74 is reset and its program count selected. The program verify signal enables the program verify circuitry within memory array 22 and the array 22 is enabled.

Next state controller 72 branches from state 166 back to the PROG_SETUP state 132, unless the address counter 78 has reached it terminal count.

The write state machine 32 cycles through states 132, 136, 140, 142 and 166 until every byte of the memory array 22 is preconditioned or a byte cannot be successfully preconditioned.

If a byte cannot be successfully preconditioned the next state controller 72 branches to PROG_DONE 1 state 148 from PROG_VER_DELAY state 142. No events occur in state 148 and next state controller 72 branches to PROG_DONE2 state 150.

During an erase operation, next state controller 72 can take only three branches 156, 158 or 159 out of state 150.

The next state controller 72 takes branch 156 to the ERASE_FAIL state 168 when a byte has not been successfully preconditioned by the time the event counter 74 has reached its terminal count. In state 168 the ERASE_ERR bit is set. From state 168 next state controller 72 returns to the POWER-UP state 120. Thus, the erase operation ends unsuccessfully.

If, on the other hand, all bytes have been successfully preconditioned the next state controller 72 takes branch 158 to the ERASE-SETUP1 state 170 from state 150. The next state controller 72 then begins the process of erasing the array 22; i.e., bringing the cell voltages to approximately 3.25 volts.

In state 170 the address counter 78 and event counter 74 are reset. These actions prepare the write state circuitry and the array for erasure.

From state 170 next state controller 72 branches to ERASE_SETUP2 state 172. Events during state 172 further prepare the WSM 32 for erasing the array. In state 172 the SBUS decodes cause the period counter 76 to be reset and the erase verify circuitry within the memory array 22 to turn on.

The next state controller 72 branches to the APPLY_ERASE state 176 from state 172. During state 176 the erase voltage is applied to the array until the period counter 76 reaches its terminal count. Next state controller 72 advances from state 176 to the ERASE_OFF state 178 when PCTRTC 88 becomes active.

in anticipation of erase verification procedures, in state 178 the period counter 76 is reset. The event counter 74 is enabled, allowing it to increment its count and the memory array 22 read lines continue to be enabled, allowing access to read memory contents. The erase verify circuitry remains turned on.

Next state controller 72 branches to state 180 from state 178.

During the ERASE_VERIFY state 180 the write state machine 32 determines whether the indicated byte of memory has been successfully erased. The events in state 180 configure the WSM 32 to perform the verification, and also execute the verification. During state 180 the period counter 76 is reset and its erase verification delay selected. The erase verification delay is approximately the time between when the erase voltage is removed and the SOUT(7:0) signals 59 are valid.

In state 180, the DLC 80 circuitry is configured to verify that the addressed byte has been successfully erased by setting the signal COMPDAT 283 to a logic one and bringing the signal CMPEN 287 active. The signals COMPDAT 283 and CMPEN 287 and the DLC 80 circuitry will be discussed in more detail herein below.

During state 180, the array's read path is turned on and the array is enabled, allowing array 22 to provide outputs SOUT(7:0) 59 to the DLC 80.

After the period counter 76 times out, the next state controller 72 determines whether the erase operation has been successful by examining the MATCH signal 94. MATCH 94 is a logic one when the byte has been successfully erased and is a logic zero when it has not.

Next state controller 72 branches to state 172 from state 180 to apply another erase pulse if MATCH 94 indicates that the byte currently addressed has not been successfully erased and the event and address counters 74 and 78 have not reached their terminal counts. The write state machine 32 cycles through states 172, 176 and 180 until the event counter 74 times out or the erasure of the addressed byte is successfully verified.

Next state controller 72 takes branch 182 to the ERASE_FAIL state 168 if a memory byte is not successfully erased after the event counter 74 reaches its terminal count. In state 168 the ERASE_ERR bit is set. Thereafter, the next state controller 72 branches back to state 120. Thus, the erase sequence ends unsuccessfully.

The next state controller 72 branches to the ERASE_INC_ADD state 184 from state 180 when a byte is successfully verified and not every byte in the array has been erased, as indicated by an inactive ACTRTC signal 92. In state 184 the address counter 78 is enabled, allowing it to increment its count and allowing signals AY 55 and AX 57 to point to another byte in array 22. In state 184, the memory array 22 and the DLC 80 are readied to perform another verify operation by bringing CMPEN 287 active, enabling the array 22 and turning on the array read path and the erase verify circuitry.

After pointing to a new byte within the array 22, the wide state machine 32 compares the current byte value to the desired value to determine whether erasure of the indicated byte is necessary. These events occur in states 180, 184 and 186.

The next state controller 72 branches to the ERASE_INC_DELAY state 186 from state 184. State 186 provides a small delay before an erase verify operation is performed. In state 186 the DLC 80 is maintained in its erase-verify configuration by keeping COMPDAT 283 set to logic 1 and COMPEN 287 active. The memory array 22 continues to be enabled, and the read path and erase verify circuitry remain on.

From state 186 the write state machine 32 branches back to the ERASE_VERIFY state 180. The DLC 80 compares the contents of the current memory location to erase voltage levels. If verification indicates that the byte is already erased, next state controller 72 will cycle through states 184, 186 and 180 until an unerased byte is located in the memory array 22 or until the address counter 78 reaches its terminal count.

The next state controller 72 branches back to state 172 from ERASE_VERIFY state 180 when an unerased memory location is reached and the address counter 78 has not yet reached its terminal count. Write state machine 32 will cycle through states 172, 176, 178, 180, 184, and 186 as described above until the end of the memory array 22 is reached or a byte cannot be successfully erased.

When every byte has been successfully erased, as indicated by ACTRTC 92 active, next state controller 72 takes branch 188 to the POWER_UP state 120. The erasure of the array 22 is thus successfully completed.

FIG. 8 illustrates in block diagram the oscillator and phase Generator 70. Oscillator 200 begins operating upon receipt of an inactive RESET signal 52. The oscillator 200 runs as long as RESETB 52 is inactive. When RESETB 52 is asserted the oscillator 200 ceases to run.

The oscillator's output 202 is provided to the phase generator 204. The phase generator 204 includes a two-bit shift register that is held inactive until activated. The shift register shifts through 4 combinations—namely, "00," "01," "11," and "10." Two decoders of phase generator 204 watch for the "01" and "10" states and generate two out clocks—namely, PH1 82 and PH2 84, respectively, which are routed to nearly all of the WSM 32 circuitry.

In the preferred embodiment, PH1/PH2 82 and 84 have a typical cycle time of 500 ns. The duty cycle of both PH1 82 and PH2 84 is approximately 25%.

The start-up timing for PH1 82 and PH2 84 in relation to RESETB 52 and SBUS(4:0) 54 can be seen in FIG. 9. RESETB 52 goes low on the rising edge of either PROGRAM 38 or ERASE 40. After RESETB 52 falls PH284 is the first clock to go active high.

SBUS(4:0) 54 becomes active on the rising edge of the second PH2 84 pulse; all WSM 32 circuitry evaluates SBUS(4:0) 54 during PH1 82 active to guarantee valid readings.

FIG. 10 illustrates in block diagram form the period counter 76. The period counter 76 includes a period counter SBUS decoder 210, a 15 bit shift register counter 212, a terminal count match circuit 214, and a latch 216.

The period counter SBUS decoder 210 controls the counter 212 and the terminal count match circuit 214. Decoder 210 decodes SBUS signals 54 and determines whether the counter's 212 count should be reset and selects among the three possible terminal counts.

The operation of SBUS decoder 210 in each state can be determined with reference to FIG. 6. For example, FIG. 6 indicates that in the APPLY ERASE state 176, that the SBUS decoder 210 selects the erase terminal count by setting PCTSELERS to a logic 1.

SBUS decoder 210 is implemented as random logic in the preferred embodiment.

The shift register counter 212 does not incorporate a counter enable and thus continues to run in all states except for those in which it is reset by an active PCTRST signal 218.

The Q outputs 220 of the shift register 212 are fed to the terminal count match circuit 214. Terminal count match circuit 214 analyzes Q outputs 220 and indicates when a selected terminal count is reached. The terminal count match circuit recognizes three possible terminal counts: erase, program, and verify, which are selected by active signals PCTSELERS, PCTSELPGM, and PCTSELVER, respectively.

Approximate time periods are 10 μsec for programming operation, 10 msec for erase operations, and 3 μsec for verification operations.

Output TCOUNT 222 is active for only one state because the counter 212 continues to increment TCOUNT 222. To store the active terminal count TCOUNT 222 latch 216 is used in conjunction with OR gate 217.

Latch 216 is reset by RESETB 52 when the write state machine 32 is first powered up, setting its Q output 224 to a logic 0. Latch 216 is also reset when the PCTRST 218 signal is asserted. When TCOUNT 222 goes active high, Q output 224 goes to a logic 1. Q output 224 keeps the latch's input at logic 1 after TCOUNT 222 goes inactive, thus keeping PCTRTC 88 at a logic 1 until latch 216 is reset by RESETB 52.

FIG. 11 illustrates in block diagram form the event counter 74. The event counter 74 includes an event counter SBUS decoder 230, a thirteen bit counter 232, an event counter terminal count select circuit 234, a latch 236, and an OR gate 238.

The event counter SBUS decoder 230 controls the counter 232 and the terminal count match circuit 234. Decoder 230 decodes SBUS signals 54 and determines whether the counter's 232 should be enabled or reset, and selects between the the two possible event counter terminal counts.

The operation SBUS decoder 230 for each WSM state can be determined with reference to FIG. 6. For example, FIG. 6 indicates that in the ERASE_VERIFY state 180 SBUS decoder 230 selects the erase terminal count by setting ECTRER.

The event counter SBUS decoder 230 is implemented as random logic in the preferred embodiment.

The counter 232 is reset by the SBUS decoder 230 whenever the WSM 32 begins to program, precondition or erase a new byte. The ripple carry counter 232 increments its count only when enabled by an active ECTREN signal 240. The Q outputs 242 of counter 232 are fed to the event counter terminal count match circuit 234.

Event counter terminal count match circuit 234 analyzes Q outputs 242 and indicates when a selected terminal count is reached. The event counter terminal count match circuit 234 recognizes two possible terminal counts: namely, erase and program, which are selected by the signals ECTRER and ECTRPG.

Event counter 74 allows over 8000 erase pulses to be applied when an erase event is selected and 50 program pulses to be applied when a program event is selected.

TCOUNT 244 is latched in exactly the same fashion as TCOUNT 222 using latch 236 and OR gate 238.

FIG. 12 illustrates in block diagram form of the address counter 78. The address counter 78 includes TTL input buffers 250, 252 address counter SBUS decoders 254, 256, a 17 bit linear counter 258 and a bypass multiplexer 260.

The buffers 250 and 252 convert the TTL address inputs A(16:0) 24 to CMOS levels. The buffer outputs AIN(16:0) 262 are applied to the bypass multiplexer 260 and the parallel load inputs of counter 258.

When the READY signal 50 is a logic high, the address counter 78 provides flow through addressing by selecting the buffered TTL outputs 262 as the outputs of bypass multiplexer 260.

The address counter SBUS decoders 254 and 256 control the operation of the counter 258. SBUS decoder 254 provides counter 258 with a reset signal ACTRRST 266. SBUS decoder 256 decodes SBUS(4:0) 54 to generate a counter enable signal ACTEN 268.

The operation of SBUS decoders 254 and 256 can be understood with reference to FIG. 6. For example, FIG. 6 indicates that SBUS decoder 256 enables counter 258 in the PROG_INC_ADD state 166 by bringing the signal ACTEN 268 to a logic 1.

The address counter's SBUS decoders 254 and 256 are implemented as random logic in the preferred embodiment.

The counter 258 is a 17 bit linear counter with parallel load and will not be described in detail herein.

During a program operation the address counter 78 operates as follows. Before the command state machine 28 issues a program command to the write state machine 32, the READY signal is a logic high indicating that wide state machine 32 is ready to perform an operation. This selects the TTL buffer outputs 262 as the output of bypass multiplexer 260.

Prior to bringing signal PROGRAM 38 to an active condition, the command state machine 28 brings the address latch enable signal ALE 49 active. ALE 49 active loads the buffered address outputs AIN(16:0) 262 into the counter 258. Signals AQ 262 and AIN 264 will be the same value until the counter 258 is enabled and increments its count.

The bypass multiplexer 260 selects counter inputs AQ (16:0) as outputs when PROGRAM 38 becomes active. The multiplexer 260 selects AQ(16:0) by forcing READY 50 inactive. The counter 258 is not allowed to increment its count during a program operation, thus counter 258 acts as an address latch during program operations.

The operation of the address counter 28 during erase operations is initially similar to that during program operations. However, the counter 258 is enabled during erase operations in the PROG_INC_ADD state 166 and ERASE_INC_ADD state 184, allowing signals AY 55 and AX 57 to cycle through the addresses within memory array 22 until the end of the array 22 is reached, as indicated by ACTRTC 92 active.

FIG. 13 illustrates in block diagram form of the data latch and comparator circuit ("DLC") 80. The DLC 80 includes eight latch and comparator circuits 270a-270h, one for each data bit; DLC SBUS decoders 282, 284, and 286; an AND gate 288; a multiplexer 290; and a latch 292.

Microprocessor 999 writes commands to flash memory 20 via data lines DATA(7:0) 26, while holding CEB 44a and WEB 46 active. The active CEB signal 44a and active WEB signal 46 enable the TTL input buffers 272a-272h within each DLC latch and comparator circuit 270a-270h converting the data at lines 26 to CMOS signals DATAIN(7:0) 27.

The CSM brings data latch enable signal DLE 47 active if DATAIN(7:0) 27 represents a program or an erase command. When DLE 47 becomes active, the data from TTL buffers 272a-272h is clocked into latches 274a-274h. During program verification the latch and comparator circuits 270a-270h operate as follows. The ERASE signal 38 is inactive, selecting the 10 inputs of multiplexers 276a-276h as the multiplexers' outputs. Thus. the data stored in latches 272a-272h is applied to the LAT inputs of comparators 278a-278h.

The comparator outputs 279a-279h indicate whether each bit of the program data matches the sense amp outputs SOUT(7:0) 59. For each comparator 278a-278h, if the two comparator inputs SOUT and LAT agree, the comparator output will be a logic one. If the comparator inputs do not agree, the output will be a logic 0.

During program verification, the operation of the comparators 278a-278h described above is modified by the active program verify signal PGVER 283. As can be seen from Table 1, when PGVER 283 is active, comparators 278a-278h output a logic 1 when the cell is at a logic 0 and the bit is desired to be a logic 1. The comparators 278a-278h indicate a match in this situation because the write state machine 32 cannot erase a programmed bit during a program operation.

TABLE 1

| | | MATCH OUTPUT | |
| SOUT | LAT | PGVER INACTIVE | PGVER ACTIVE |
| --- | --- | --- | --- |
| 0 | 0 | 1 | 1 |
| 0 | 1 | 0 | 1 |
| 1 | 0 | 0 | 0 |
| 1 | 1 | 1 | 1 |

The outputs 279a-279h of all the comparators 278a-278h are ANDed together by AND gate 288. The output of AND gate 288 is a logic 1 when each bit of SOUT(7:0) and DATAIN (7:0) match and a logic 0 when SOUT(7:0) and DATAIN (7:0) do not match.

The AND gate 288 output is applied to the 11 input of the output multiplexer 290. The 11 input of multiplexer 290 is selected as the multiplexer output by an active CMPEN signal 287.

CMPEN 287 is active during program verification, thus allowing the AND gate output 289 to flow through latch 292 and control the logic state of MATCH signal 94.

The value of MATCH 94 is stored by latch 292 when the next state machine 72 moves out of the program verification state. The Q output of latch 292 is fed back to the 10 input of multiplexer 290. When CMPEN 287 becomes inactive, the 10 input of multiplexer 290 is selected allowing it to control the latch 292.

MATCH 94 is reset by RESETB 52.

The operation of the data latch and comparator circuits 270a-270h during erase verification is similar to that described above for program verification, with the following exceptions. First, 11 inputs of multiplexers 276a-276h are set to a logic 1 by the active COMPDAT1 signal during erase verification. This establishes a voltage reference with which to compare the sense amp outputs. Second, the active ERASE signal 38 selects the 11 inputs of multiplexers 276a-276h to be output to the comparators 278a-278h. Third, the PGVER signal is inactive, which permits comparators 278a-288h to operate without modification.

The DLC SBUS decoders 282, 284 and 286 help control the operation of data latch and comparator circuits 272a-272h. The operation of DLC SBUS decoders 282, 284 and 286 can be determined with reference To FIG. 6. For example, FIG. 6 indicates that in the ERASE_INC_ADD, ERASE_INC_DELAY and ERASE_VERIFY states 184, 186, 180 DLC SBUS decoder 286 sets CMPEN signal high.

In a preferred embodiment, DLC SBUS decoders 282, 284, and 286 are implemented in random logic.

FIG. 14 illustrates in block diagram form the status register 34. The status register 34 includes a clock generator 300; five output latches 302a-302e, one for each bit of signal STATUS(7:3) 56; status register SBUS decoders 304 and 306; latches 308 and 312; OR gates 310 and 314; and inverter 316.

The status register's outputs 56 are synchronized to output enable bar signal OEB 46a. The clock generator 300 accomplishes this synchronization by generating a set of clock pulses PH'1/PH'2 320 whenever OEB toggles. Clock pulses PH'1/PH'2 320 control the clocking in of data into output latches 302a-302e. Thus, it will be understood that OEB 42 must be toggled in order to read valid data from the output latches 302a-302e.

The signals READY 50, IDLE 53, and LOWVPP 51 are input directly to the D inputs of output latches 302a–302c respectively.

Status register SBUS decoder 304 decodes SBUS(4:0) 54 to detect program failures. When SBUS decoder 304 detects a failure, PRG-FAIL signal 322 is set to a logic 1. Because SBUS(4:0) 54 indicates a program failure for only one state period, the active PRGFAIL signal 322 is stored using latch 308 and OR gate 310, until the microprocessor 999 chooses to reset the status register 34. The status register 34 is reset by bringing STATRS 45 active. This pair of devices 308 and 310 operates in the same as a substantially similar pair of devices in the period counter 76.

Status register SBUS decoder 306 decodes SBUS(4:0) 54 to detect erase failures. When SBUS decoder 306 detects a failure ERSFAIL signal 324 is set high. Because SBUS(4:0) 54 indicates an erase failure for only one state period, the active ERSFAIL signal 324 is stored using latch 312 and OR gate 314 until the microprocessor 999 chooses to reset the status register. This pair of devices 312 and 314 operates in the same manner as a substantially similar pair of devices in the period counter 76.

FIG. 6 includes the operation of status register SBUS decoders 304 and 306. For example, FIG. 6 indicates that for all hardware failure states, PRG_ERR is set.

In a preferred embodiment, both status register SBUS decoders 304 and 306 are implemented in random logic.

The active outputs of latches 308 and 312 are reset when status register reset signal STATRS 45 is active high, which occurs as the result of the CLEAR STATUS REGISTER command from the microprocessor 999.

STATUS(7:3) outputs 56 include RDY/BSY signal, also known as STAT7. When RDY/BSY is a logic zero the wide state machine 32 is busy. A logic one on STAT 7 indicates that the write state machine 32 has completed its operation and is prepared to perform another operation and that the other status outputs are valid.

The STAT 6 signal is also known as the ERASE_SUSPEND signal. ERASE_SUSPEND becomes active, a logic 1, when the WSM 32 has entered an idle state during an erase operation, and indicates that array 22 is readable. ERASE_SUSPEND is set and cleared by the synchronizer 30, based upon a request from the microprocessor 999 and the status of the WSM 32.

The STAT 5 signal is also known as the erase error ERASE_FAIL signal. The ERASE_FAIL signal is set to a logic 1 if the WSM 32 cannot successfully pre-program or erase the array. ERASE_FAIL is also set to a logic if the erase command is botched or a hardware error is encountered. The ERASE_FAIL signal is set by the WSM 32 and cleared by the STATUS REGISTER CLEAR command.

The STAT 4 signal is also known as the program error signal PRG_FAIL. PRG_FAIL is set to a logic one if the WSM 32 cannot successfully program a byte. PRG_FAIL is also set to a logic 1 if an erase command is botched or a hardware error is encountered. PRG_FAIL is set by the SBUS signals 54 and cleared by the STATUS REGISTER CLEAR command.

The STAT 3 signal is also known as the VPPLOW signal 51. VPPLOW 51 is set if the programming voltage Vpp 36 drops anytime during a program or erase operation. However, if PRG_FAIL or ERASE_FAIL is also set then the low Vpp 36 level had no effect on the operation. VPPLOW 51 is cleared by STATRS.

The status register 34 also outputs to the synchronizer 30 the status register reset bar signal STATRB 61, which is an inversion of STATRS 45.

In summary, circuitry for programming and erasing a non-volatile flash memory has been described. Once a program or an erase sequence is initiated, the write state circuitry generates all control signals necessary to complete the requested operation, thus freeing the microprocessor 999 to perform other functions.

II. TESTING OF THE WRITE STATE MACHINE

A. Overview

Functional testing of WSM 32 is essential to guarantee the reliability of the flash memory. Executing the program and erase algorithms controlled by WSM 32 does not provide satisfactory functional verification for at least one reason. In the nominal case, the program and erase algorithms do not encompass every possible state of write state machine 32. Thus, such testing does not insure that write state machine 32 responds properly to fail states and hardware errors. Accordingly, the present invention allows the various circuits of WSM 32 to be tested individually to verify that each one performs properly its particular task. Next state logic 110 is cycled through all its possible inputs to ensure that it responds with the correct output. The period counter is tested to ensure that it properly times each of the time periods of interest. The event counter is tested to verify that each of its terminal counts becomes active at the proper time. The address counter is tested to guarantee that it advances properly. The data latch and comparator is checked to verify that it performs comparisons properly.

Each of these tests requires modifications to WSM 32 as previously described to allow the various circuits to be isolated from the rest of WSM 32. Modifications also include the addition of a test mode controller 29, which allows external signals to be applied to each circuit.

B. Test Mode Controller

Testing of write state machine 32 is controlled by test mode controller 29. Test mode controller 29 includes registers that store a number of writable test bits. These test bits may be individually set to set-up tests of individual circuits within WSM 32. When propagated to write state machine 32, the test bits alter the normal operation of WSM 32. Test mode controller 29 also includes read-only registers that allow the internal state of WSM 32 to be determined during each test.

Referring to FIG. 1, the operation of test mode controller 29 is controlled by command state machine 28. In response to the appropriate combination of signals, CE2 43 and WEB 46, and data signals 27, command state machine 28 enables test mode controller 29. Thereafter, commands and data may be written to test mode controller 29 using address pins 24 and data pins 26. After test bits are set, testing begins upon receipt of an active GO signal from command state machine 28. During or upon completion of a test, results can be determined by reading test mode registers.

Enabling test mode controller 29 is a multistep process. First, WEB 46 is raised to 12 volts. Second, after a wait of at least 200 nanoseconds, CE2 43 is also pulled up to 12 volts. Finally, after a second wait of at least 200 nanoseconds, WEB 46 is lowered to 5 volts. In response to this sequence, command state machine 28 forces test enable signal ENTESTB to its active, logic-low state. Thereafter, test latches within test mode register 29 may be accessed.

Most tests begin by writing to test registers. Test latch writes are performed much like any other write to flash memory 20. The WRITE TEST LATCH command is described in FIG. 2, along with other test mode commands. A test mode write takes 2 cycles. During the first cycle, hexadecimal 5F is written on data pins 26. During the second cycle, the memory user addresses the desired bits within the desired test register using address pins 24. The desired data is written using data pins 26.

After writing test mode registers, it may be desired to read them to verify that the registers contain the correct data. Test registers may be read using the command TEST LATCH READ. This command is given by writing OF (hexadecimal) to pins 26. Data will be available on pins D(7:3) 26 while CEB 44 and OEB 42 are low.

Once the desired test bits have been set, testing begins by giving the command TEST MODE GO; i.e. by writing 2F (hexadecimal) on data pins 26. TEST MODE GO activates the outputs of the test mode latches and propagates them to write state machine 32. This command ensures that all test mode signals become active at the same time.

The completion of a program or erase operation can be sensed by reading status register 34. Afterward, if desired, various internal signals may be read. Outputs from next state logic 110 are available after issuing to a TEST LATCH READ. Thereafter, subsequent read cycles access test registers and not memory array 22. Test mode controller 29 allows a user to read the address at which erase verification failed. Failing addresses are output in response to a series of read commands. In response to each read command, four bits or five bits of the requested address are output on pins D(7:3). The addresses for the address latch bits are shown in FIG. 15.

The commands WRITE TEST LATCH, TEST MODE GO, TEST LATCH READ, and TEST MODE STOP redirect the output path away from the array and direct the read path to test mode registers. Normal memory array outputs can be redirected to data pins 26 by issuing the USER MODE READS command.

After testing is completed, test mode signals are deactivated using the TEST MODE STOP command. This command returns write state machine 32 to normal operation. The read path may then be returned to the memory array using the USER MODE READS command.

FIG. 16 illustrates in block diagram form test mode controller 29. Test mode controller 29 includes several test register selects and test registers. The operation of register selects 302, 304, 306, 308, 310, 311, and 312 and registers 320, 322 324, 326, 328 and 340 are controlled by four signals from command state machine 28. Those four signals are ENTESTB 314, LATWRITEB 316, LATREADB 318 and GO 320.

The outputs of all test registers are held inactive and reset by the test mode enable signal, ENTESTB 314. While ENTESTB 314 is inactive-logic high, test mode outputs 25 cannot change. When inactive ENTESTB 314 also holds test registers in reset. When ENTESTB 314 goes active, registers 320, 322, 324, 326, 328 and 340 may be written to or read. Command state machine 28 brings ENTESTB 314 inactive in response to CE2 43 falling below 12 volts.

After entering test mode, command state machine 28 brings LATWRITEB 316 active-logic low in response to a TEST LATCH WRITE command. Similarly, command state machine 28 forces the test register read signal, LATREADB 318, active low in response to a TEST LATCH READ command.

Register selects 302, 304, 306, 308, 310, 311 and 312 select the appropriate register based upon addresses available on A(7:4) 24. Table 17 lists the addresses of registers 320, 322, 324, 326, 328, and 340. FIG. 17 also lists the addresses of the various test bits stored by the registers. When a particular register is selected by the appropriate signals on A(7:4) 24, its associated register select enables it to perform the operation indicated by signals LATWRITEB 316 and LATREADB 318. Thus, for example, in response to A(7:4)=0101 (binary) and active LATWRITEB, register select 306 outputs an active write signal, WRITEL5 322, to register 324. Similarly, in response to the address A(7:4)=0111 (binary) and LATREADB 318 active, register select 312 forces it latch read signal, READL7 324, active.

Register select 312 allows various terminal count signals to be read. Those signals are listed in FIG. 15. These internal signals cannot be written. Register select outputs 357 and 358 are routed to WSM circuits to enable these signals to be output.

Data stored within test registers 320, 322, 324, 326, 328, 340 and from WSM 32 are output onto D(7:3) 26 while LATREADB 318 is active. Data on pins D(7:3) 26 is written into the test registers while LATWRITEB 316 is active. Data written to registers 320, 322,324, 326, 328 and 340 is not propagated until the command state machine 28 brings GO signal 320 active in response to the command TEST MODE GO.

The functions performed by the test mode bits are described in FIG. 17. By altering the normal operation of write state machine 32, the test bits permit flash memory users to tailor tests to their particular needs.

Test bits SLFRC 325 and TDOUT(4:0) 356 are used together to force write state machine 32 to a known state. SLFRC 325 bypasses the normal outputs of next state logic 110 and selects TDOUT(4:0) 356 to be output as SBUS(4:0) 54. Thus, write state machine 32 may be forced to any state by appropriately choosing the value of TDOUT(4:0) 356.

When active, DISOSC 348 disconnects internal oscillator and phase generator 70 from write state machine 332. DISOSC 348 also connects two address pins, A2 and A3, to write state machine 32 as clock phases. Thus, DISOSC 348 allows external clocking of write state machine 32.

ISOSM 350 disconnects outputs from next state logic 110 from the remainder of write state machine 32. This allows next state logic 110 to be tested without affecting the remainder of flash memory 20. It may also be used in conjunction with other commands to control externally the inputs applied to other circuits.

NST 336 couples outputs from period counter 76 to the inputs of next state logic 110. When the period counter is enabled next state logic 110 can be cycled through all its possible inputs.

RSTOVERIDE 338 overrides the internal reset RESETB 52 and allows external control of the resetting of WSM 32 via address pin A10.

NBL 326 and GNDSEN 328 are both used for the testing of a data latch comparator. By properly setting them the comparator inputs SOUT(7:0) 59 can be controlled.

Test mode bits 325, 326, 328, 330, 332, 336, 338 and 340 may be combined to test next state logic 110, address counter 78, period counter 76, event counter 74, and DLC 80. The tests for each circuit will be described in detail below. Afterwards, the modifications of WSM 32 necessary to accommodate all the tests will be discussed together as many of the tests use the same test mode bits.

D. Next State Logic Testing

Next state logic 110 functions as the brain of write state machine 32 by determining the next state of write state machine 32. Next state logic 110 selects the next state based upon signals generated by address counter 78. event counter 74, period 76 counter and DLC 80, etc. Thus, testing of next state logic 110 focuses on whether it generates the appropriate SBUS values for all possible inputs.

The method of verifying the operation of next state logic 110 without affecting array 22 is illustrated in FIG. 18. Briefly stated, testing begins by configuring test mode controller 29 to logically isolate next state logic 110 from the remainder of wide state machine 32 and to provide alternative inputs to next state logic 110. By toggling externally supplied clocks, the tester can cycle next state logic 110 through all of its possible inputs, read its outputs and determine by comparison to expected outputs whether next state logic 110 is operating properly.

Testing of next state logic 110 is preferably executed using a computer controlled tester to generate all necessary input signals, read all output data, and generate test counters. However, less sophisticated means of implementing the present test may also be used.

Testing of next state logic 110 begins in step 600 by enabling the test mode of flash memory 20, as discussed in Section IIB.

Upon entering test mode, in step 602 the tester configures test mode controller 29 to isolate next state logic 110 from its normal inputs and to isolate the rest of write state machine 32 from outputs from next state logic 110. First, test mode bit RSTOVERIDE 338 is set to allow external control of the resetting of write state machine 32 via address pin A10. A10 should be held active low initially. Second, test mode bit DISOSC 348 is set to override the write state machine's internal clocks and allow external clocking via address pins A2 and A3. Third, test mode bit ISOSM 350 is set to force SBUS(4:0) to the power-up state. ISOSM 350 allows next state logic 110 to be tested without affecting most of the write state machine 32. Setting NST 336 couples outputs from period counter 76 to the inputs of next state logic 110.

After configuring test mode controller 29, the tester proceeds to state 604. There the tester initializes a state counter, COUNT, generated and stored by the tester, to zero. COUNT keeps track of the number of states that next state logic 110 has been cycled through. Using COUNT the tester determines whether testing should continue or stop.

Verification of next state logic 110 begins in step 606 when test mode signals 330,332,336 and 338 are propagated to write state machine 32 by issuing a TEST MODE GO command.

In step 608 the tester toggles two external clocks, applied via address pins A2 and A3, thus, changing the inputs to next state logic 110.

In state 610 the tester reads the value of SBUS(4:0) 54.

In state 612 the tester compares the SBUS values output from flash memory 20 with those expected. Disparities between the two values are flagged and stored. It is possible, alternatively, to stop testing immediately upon discovery of a disparity between values.

In step 614, state counter COUNT is incremented. During step 616, based upon COUNT the tester determines whether next state logic 110 has been cycled through all of its possible states. The number of states is $2^N$, where N is the number of inputs to next state logic 110. If COUNT has not reached it maximum value the tester branches to step 608, to toggle the clocks and change the state of next state logic 110.

The tester cycles through steps 608, 610, 612, 614, and 616 until next state logic has been stepped through every one of its possible states. When that occurs, testing of next state logic 110 stops.

E. Event Counter Testing

Within write state machine 32 event counter 74 determines if the maximum number of erase and program pulses have been applied to each byte within memory array 22. Testing therefore focuses on whether event counter 74 brings its terminal count signal ECTRTC 90 active-high after the appropriate number of pulses. Fifty pulses are appropriate for programming and 8192 for erasure.

FIG. 19 illustrates the method of testing event counter 74. Briefly stated, the test involves coupling an external clock to event counter 74, forcing the write state machine 32 to enable event counter 74 to increment its count and toggling the external clock. The number of external clock pulses required to bring ECTRTC 90 active is then compared to the expected number. FIG. 19 illustrates a method of testing event counter 74 during programming; however, the test is substantially the same for erasure. The differences between the two tests will discussed as they arise.

The test of FIG. 19 is preferably executed using a computer controlled tester to generate all necessary input signals, read all output data, and to generate and store all test counters. Less sophisticated means of implementing the present test may also be used, however.

Testing of event counter 74 begins in step 800 by enabling the test mode of the flash memory, as discussed in Section IIB.

During step 802 test mode controller 29 is configured to test event counter 74. First, test mode bit RSTOVERIDE 338 is set to allow external control of the resetting of write state machine 32 via address pin A10. A10 should be held active low initially. Second, test mode bit DISOSC 348 is set to override the write state machine's internal clocks and allow external clocking via address pins A2 and A3. Third, test mode bit SLFRC 342 is set to allow external control of the state of write state machine 32 by forcing SBUS(4:0) 54 to a particular state. When SLFRC 342 is set the state of write state machine 32 is controlled by TDOUT(4:0) 356. Testing event counter 74 requires that TDOUT(4:0) 356 be set to a state in which event counter 74 is enabled to increment its count by an active ECTREN 240. To test the program count FIG. 6 indicates that TDOUT(4:0) 356 should be set to 10001 (binary), representing program equalization state 140. The number of pulses event counter 74 allows during erasure may be determined by setting TDOUT(4:0) 356 to 10010 (binary), indicating erase off state 178.

After test mode controller 29 has been configured the test mode bits are propagated to write state machine 32 in step 804.

In step 806 a test counter, generated and stored by the tester, is initialized to one. The test counter tracks the number pulses allowed by event counter 74.

In step 808, just prior to starting event counter 74, the tester writes a TEST LATCH READ command using the register address for ECTRTC 90 indicated in FIG. 15; i.e. 08 (hexadecimal). The tester can now determine the state of ECTRTC 90 by monitoring data pin D6. Also in step 808 A10 is brought inactive high.

In step 809 external clocks applied A2 and A3 are toggled to advance the count of event counter 74.

Afterward, in step 810, event counter 74 is enabled to analyze its count and determine whether its terminal count has been reached. This is done by forcing SBUS(4:0) 54 to the appropriate state. If the program terminal count is being tested then TDOUT(4:0) 356 is set to 01111 (binary), program verify delay state 142. On the other hand, if the erase terminal count is being tested then TDOUT(4:0) 356 is set to 01110 (binary), erase verify state 180.

From step 810, the tester branches to state 811, where the external clocks are toggled. This propagates the output 244 of terminal match circuit 234 through D flip-flop 236, thus allowing ECTRTC 90 to change state.

In step 812, the tester examines ECTRTC 90 to determine whether it is active.

The tester branches to step 814 if ECTRTC 90 is inactive. The tester compares the current value of the test counter to the expected pulse count. In TDOUT(4:0) 356 is set to program equalization state 140 then the expected count is 50. On the other hand, if TDOUT(4:0) 356 is set to erase off state 178, 8192 pulses are expected before ECTRTC 90 becomes active.

The next step executed by the tester depends on the outcome of the comparison in step 814. If the value of the test counter exceeds the expected value, the tester proceeds to step 816. There the tester records that event counter 74 failed the test and the current value of the test counter, and testing stops. On the other hand, if the test counter value is less than the expected pulse counter the tester proceeds to step 818.

With step 818 the tester increments the test counter. The tester then branches forward to step 819. There the tester forces SBUS(4:0) 54 to a state in which event counter 74 is enabled to increment its count. From step 819, the tester branches back to step 810 where the count of event counter 74 is advanced by toggling the external clocks.

Assuming that event counter 74 does not bring ECTRTC 90 active in response to more clock pulses than expected, the tester branches through steps 809, 810, 811, 812, 814, 818 and 819 until ECTRTC 90 goes active. The tester responds to active ECTRTC 90 by branching to step 820.

The tester determines whether event counter 74 brought ECTRTC 90 active at the appropriate point. If the test counter does not equal the expected pulse indicated by the state selected, then the tester branches to step 816 to record that event counter 74 failed the test and the value of the test counter when failure occurred. On the other hand, if the test counter equals the expected pulse count the test branches to state 822. There the tester records that event counter 74 passed the test. Testing then stops.

F. Period Counter Testing

Within write state machine 32 period counter 76 determines the time duration of erase and program pulses as well as verification delays for program and erasure. Testing therefore focuses on whether period counter 76 brings its terminal count signal PCTRTC 88 active-high after the appropriate time has elapsed. Pulses should last 10μS for programming and 10 ms for erasure.

FIG. 20 illustrates the method of testing period counter 76. Briefly stated, the test involves over-riding the internal reset and enabling period counter 76 to increment its count. The amount of time elapsed between when the external reset on A 10 goes inactive and when PCTRTC 88 becomes active is then compared to the expected time duration. FIG. 20 illustrates a method of determining the duration of programming pulses. The method is substantially the same for erase pulses, however. The differences between the two tests will discussed as they arise.

The test of period counter 76 is preferably executed using a computer controlled tester to generate all necessary input signals, read all output data, and to generate and store all test count and timers. Less sophisticated means of implementing the test may also be used, however.

Testing of period counter 76 begins in step 900 by enabling the test mode, as discussed in Section IIB.

During step 902 test mode controller 29 is configured to test period counter 76. First, test mode bit RSTOVERIDE 338 is set to allow external control of the resetting of write state machine 32 via address pin A10. A10 should be held active low initially. Second, test mode bit SLFRC 342 is set to allow control of the state of write state machine 32 via TDOUT(4:0) 356. Testing period counter 76 requires that TDOUT(4:0) 356 be set to a state in which period counter 76 is enabled by an inactive-high period counter reset signal PCTRRST 218. FIG. 6 indicates that TDOUT(4:0) 356 should be set to 01000 (binary), representing program state 136 to verify the length of programming pulses. The duration of pulses during erasure may be determined by setting TDOUT(4:0) 356 to 00010 (binary), indicating apply erase state 176. Program verification delay and erase verification delay pulse duration may also be determined by setting TDOUT(4:0) 356 to 01111 (binary) and 01110 (binary), respectively.

After test mode controller 29 has been configured the test mode bits are propagated to write state machine 32 in step 904.

In step 906, the tester writes a TEST LATCH READ command using the register address for PCTRTC 88 indicated in FIG. 15; i.e., 08 (hexadecimal). The tester can now determine the state of PCTRTC 88 by monitoring data pin D5.

In step 908 A10 is brought inactive high while at the same time a pulse timer within the tester is started. During step PCTRTC 88 is then monitored until it goes active-high. The pulse timer is then stopped.

In step 910 the pulse timer's elapsed time, representing the time duration of the period counter's program pulse, is compared to the expected time duration. If the two values are not equal, or substantially the same, the tester branches to step 912 to record that period counter 76 failed the test. On the other hand, if the two values are equal or substantially the same, the tester branches to step 914. There the tester records that period counter 76 passed the test.

The tester completes testing after steps 912 and 914 by branching to step 916. Testing then halts.

G. Address Counter Testing

Within write state machine 32 during erasure address counter 78 cycles through all addresses within memory array 22. Testing focuses on whether address counter 78 counts in sequence and whether it brings its terminal count ACTRTC 92 signal active at the appropriate address. Testing also determines whether address counter 78 resets itself at the appropriate time.

FIG. 21 illustrates the method of testing address counter 78. Briefly stated, the test involves over-riding the internal reset and clocks, coupling external reset and clock signals to write state machine 32 and loading an address into address counter 78. Address counter 78 is then forced to increment its count. The address stored in address counter 78 is then compared to the expected address.

The test of FIG. 21 is preferably executed using a computer controlled tester to generate all necessary input signals, read all output data, etc. Less sophisticated means of implementing the present test may also be used, however.

Testing of address counter 78 begins in step 1000 by enabling the test mode, as discussed in Section IIB.

In step 1002 the tester brings Vpp 36 to zero volts. Holding Vpp 36 at ground through-out testing prevents the programming of memory array 22. After setting Vpp 36 the tester proceeds to step 1004.

During step 1004 test mode test mode controller 29 is configured to test address counter 78. Like the tests of event counter 74 and period counter 76, test mode bit RSTOVE RIDE 338 is set to allow external control of the resetting of write state machine 32. Address pin A10, which functions as the external reset, should be held active low initially. Second, test mode bit SLFRC 342 is set to allow TDOUT(4:0) 356 to control the state of write state machine 32. Testing address counter 78 requires that TDOUT(4:0) 356 be set to a state in which address counter 78 is enabled to increment its count. The enabling of address counter 78 is controlled by address counter enable signal ACTEN 268. ACTEN 268 is brought active by setting TDOUT(4:0) 356 to 01001 (binary), representing program increment address state 166.

Because address pins A2, A3, and A 10 are used for other purposes during testing, ptior to propagating the test signals to write state machine 32 an address must be loaded into address counter 78. This is done in step 1006 using the PROGRAM command discussed in Section I. The address chosen is a matter of choice.

After loading in a starting address, the test mode bits are propagated to write state machine 32 in step 1008.

In step 1010, the tester writes a TEST LATCH READ command using the address of a set of bits within address counter 78. Test mode controller 29 cannot output all seventeen bits of AQ(16:0) 264 at once. Test mode controller allows 29 these bits to be read in groups of four or five. Thus, the set of four bits to be monitored should be selected based upon those bits that should change state as address counter increments from the initial address loaded into address counter 78 in step 1006. The addresses for each group of bits is listed in FIG. 15.

Alternatively, in step 1010 test mode controller 29 may use the address of the address counter terminal count signal ACTRTC 92. By monitoring ACTRTC 92 the tester can determine whether address counter 78 correctly signals a terminal count.

After selecting address counter signals to monitor, in step 1012 testing begins. The external reset on A10 is brought inactive high and the external clocks on A2 and A3 are toggled. Afterward, in step 1014, the address counter bits addressed in step 1010 are read.

In step 1016 the address read in step 1014 is compared to the expected address, which is calculated by the tester based upon the initial address and the number of clock pulses applied in step 1012. If the two addresses are not the same, the tester branches to step 1018 to record that address counter 78 failed the test. On the other hand, if the two addresses are the same, the tester branches to step 1020. There the tester records that address counter 78 passed the test.

The tester completes testing after steps 1018 and 1020 by branching to step 1022. Testing may then halt.

If the tester desires to run another test it issues a TEST MODE STOP command. This stops the propagation of test mode bits to write state machine 32. The tester may then latch in a new address by branching back to step 1006.

The method of FIG. 21 may be modified to test other functional features of address counter 78. In one alternative test, the response of address counter 78 to ACTRST 266 is verified by forcing SBUS(4:0) 54 to a state in which address counter 78 is reset; i.e., either ERASE state 164 or ERASE SET-UP 1 state 170. In another test, the functionality of address counter 78 is verified by forcing SBUS(4:0) 54 to another state in which address counter 78 increments its count; i.e. ERASE_INC_ADD state 184. In yet another test, the functionality of ACTRTC 92 is verified by forcing SBUS(4:0) 54 to either of the increment states, PROG_INC-ADD 166 or ERASE_INC_ADD 184. Verification of all of these conditions ensures proper address counter 78 operation.

H. Data Latch Comparator Testing

DLC 80 determines the success of programming and erasure. DLC 80 does so by comparing values provided by the memory array sense amplifiers to reference values. The results for each bit comparison are ANDed together to generate MATCH 94, which is active when the requested operation was successful. Testing thus focuses on whether DLC 80 correctly performs comparisons. A preferred test is "walking" a zero through DLC 80 to determine whether each bit of the 8-bit DLC 80 performs properly.

FIG. 22 illustrates the method of testing DLC 80. Briefly stated, the test involves over-riding the internal reset and clocks, and coupling external reset and clocks. DLC 80 is then forced to perform a comparison. The tester can verify the proper operation of DLC 80 because it can control the inputs to the comparators and determine the proper value of MATCH 94.

FIG. 22 illustrates a method of testing comparisons made during programming. The test is substantially the same for erasure, however. The differences between the two tests will discussed as they arise.

The test of FIG. 22 is preferably executed using a computer controlled tester to generate all necessary input signals and read all output data. Less sophisticated means of implementing the present test may also be used, however.

Testing of DLC 80 begins in step 1100 by enabling the test mode, as discussed in Section IIB.

In step 1102 configuration of test mode controller 29 to test DLC 80 begins by over-riding internal clocks and reset signals. Test mode bit RSTOVERIDE 338 is set to allow external control of the resetting of write state machine 32. Address pin A10 is held active low initially.

Configuration of test mode controller 29 continues in step 1104 by setting the control signal to be applied to DLC comparators. The operation of DLC comparators are determined by program verify signal PGVER 285. Table 1 and pages 27–28 of the Detailed Description describe the operation of DLC 80. The operation of DLC 80 while PGVER 285 is active high is verified by setting TDOUT(4:0) 356 to program verify delay state 142; i.e., 01111 (binary). Note that the state selected must also be one in which the DLC 80 is enabled to make comparisons; i.e., CMPEN 282 must also be active. The tester can verify the operation of DLC 80 during erase operations by choosing a state in which CMPEN 282 is active and PGVER 285 is inactive. Erase verify state 180 is such a state. In other words, the operation of DLC 80 during erasure can be tested by setting TDOUT(4:0) 356 to 01110 (binary).

Having set PGVER 285 the voltage levels applied to SOUT comparator inputs must be set. SOUT (7:0) 59 inputs are set using test mode bits NBL 344 and GNDSEN 346. SOUT (7:0) 59 are forced to a logic 0 by setting NBL 344 to a logic 1 and GNDSEN 346 to a logic 0. SOUT (7:0) 59 are set to a logic 1 by setting NBL 344 to a logic 1 and GNDSEN 346 to a logic 1.

In step 1106 the LAT inputs of the DLC comparators are selected using the PROGRAM command. The PROGRAM command allows ILAT inputs to be set to any random pattern of 1 s and 0s by loading DLC 80.

In step 1108, the test mode bits are propagated to WSM 32.

The tester prepares to read the results of the impending test by writing a TEST LATCH READ command in step 1110. The address for MATCH 94 is shown in FIG. 15.

The tester allows DLC 80 to perform a comparison in step 1112. This is done by pulling A10 inactive high and toggling the external clocks applied to pins A2 and A3. Afterward, in step 1114, the results of that comparison are determined by reading MATCH 94.

In step 1116 the operation of DLC 80 is verified by comparing the value of MATCH 94 read in step 1114 to the expected value. The expected value of MATCH 94 is determined using Table 1. If the value read is not the expected value the tester records that the DLC 80 failed the test in step 1118. On the other hand if the values do match, the tester branches to step 1120. There the tester records that DLC 80 passed the test. From both step 1118 and step 1120 the tester branches to step 1122 and indicates that the test of DLC 80 is completed.

FIG. 22 shows a single test of DLC 80. A number of different tests of DLC 80 can be run using the steps of FIG. 22 and varying PGVER 285, SOUT (7:0) 59, and LAT.

I. Status Register Testing

The function of status register 34 is to indicate to users the status of the flash memory. Status register 34 does so via status bits 56, which are called RDY/BSY, ERASE SUSPEND, LOW VPP, PRG FALL, and ERASE FALL. Testing determines whether status register 34 correctly identifies erase fail and program fail states.

FIG. 23 illustrates the method of testing status register 34. Briefly stated, the test involves over-riding the internal reset and clocks, and coupling external reset and clocks. The write state machine 32 is then forced to a fail state. The method of FIG. 23 that can be used to test both the ERASE FAIL bit and the PRG FAIL bit.

The test of FIG. 23 is preferably executed using a computer controlled tester to generate all necessary input signals and read all output data. Less sophisticated means of implementing the present test may also be used, however.

Prior to testing register 34, it should be reset using the CLEAR STATUS REGISTER command. This is done in step 1200.

Testing of status register 34 begins in step 1201 by entering the test mode, as discussed in Section IIB.

In step 1202 test mode controller 29 is configured to test status register 34. Configuration begins by overriding internal clocks and reset signals as previously discussed. Address pin A10 should be held active low initially. Next, test mode bit SLFRC 342 is set to allow TDOUT(4:0) 356 to control the state of write state machine 32. Testing of fails bits stored by status register 34 requires that TDOUT(4:0) 356 be set to one of the two fail states. Write state machine 32 is forced to program fail state 160 by setting TDOUT(4:0) 356 to 00101 (binary). Similarly, write state machine 32 is forced to erase fail state 166 by setting TDOUT(4:0) 356 to 01011 (binary).

In step 1204 test mode bits are propagated to write state machine 32. Afterward, in step 1206, the tester brings the reset inactive by pulling A10 high. The clocks applied to pins A2 and A3 are then toggled.

The tester reads the results of the test by writing a READ STATUS REGISTER command in step 1208.

The tester compares the state of the fail bits to the their expected states in step 1210, as determined by state 1202. If the states read are not those expected the tester branches to state 1212 to record that status register 34 failed the test. On the other hand, if the states read are those expected status register 34 passed the test, which the tester records in step 1214. From both step 1212 and step 1214 the tester branches to step 1216 and indicates that the test of status register 34 is completed.

J. Modifications to WSM to Permit Testing

Testing of the circuits within write state machine 32 requires many modifications to the circuits themselves. One modification allows internal clocks PH182 and PH284 and reset signal RESETB 52 to be overridden and driven externally. Another modification allows the state of write state machine 32 to be set externally. Another modification is the addition of a test bus to output previously unavailable signals to data pins D(7:0) 26. These and other modifications are discussed below.

Modifications to oscillator and phase generator 70 allow external clocking of write state machine 32. The application of external clocks via address pins A2 and A3 requires the addition of test phase driver 261 to address counter 78, as shown in FIG. 12. Test phase clock driver receives address signals A(3:2) and drives them to oscillator and phase generator 70 as test phases TPH1 and TPH2.

FIG. 8 illustrates oscillator and phase generator 70 and the modifications necessary to accommodate new signals TPH1 and TPH2 and DISOSC 348. Multiplexer 205 disconnects phase generator 204 in response to an inactive DISOSC 348. While DISOSC 348 is active, multiplexer 205 outputs test phases TPH1 and TPH2.

When DISOSC 348 is inactive multiplexer 205 transmits outputs of phase generator 204.

Allowing control of RESETB 52 via address pin A10 necessitates modifications of synchronizer 30. These modifications include the addition of a 2-to-1 multiplexer and two new input signals: A10 and RSTOVERIDE 354. A signal generated by synchronizer 30 provides one input to the multiplexer while A10 provides the other. During testing of write state machine 32, RSTOVERIDE 354 is active and selects A10 to be output as RESETB 52. Otherwise the signal generated by synchronizer 30 is selected to function as RESETB 52.

Note, the external reset applied via pin A10 is active low, just like RESETB 52, which A10 replaces.

A number of modifications to next state controller 72 are required to test write state machine 32. Next state controller 72 must allow the state of write state machine 32 to be set externally. Next state logic 110 must also accommodate alternative input signals. FIG. 24 illustrates the changes made to achieve these goals.

Modifications to allow alternate inputs include coupling one 2-to-1 multiplexer 700 to each next state logic input. The normal inputs, discussed in Section I, are applied to set of multiplexer inputs. The other set of multiplexer inputs are coupled to outputs PVAL(14:0) 702 from period counter 76. NST 336 selects among the two sets of inputs. Thus, when active, NST 336 both isolates next state logic 110 from its normal inputs and couples it to alternate inputs, PVAL(14:0) 702.

NOR gates 704 surround the output side of next state logic 110 and replace the inverters shown in FIG. 4. In conjunction with test mode signal ISOSM 350, gates 704 isolate the rest of write state machine 32 from the output signals 114 of next state logic 110. Output signals 114 are NORed with ISOSM 350. Thus, when ISOSM 350 is active high, SBUS(4:0) 54 are forced to a logic zero. SBUS(4:0)=00000 (binary) is defined as power-up state 120, a state in which write state machine 32 does nothing. Thus, the testing of next state logic 110 does not effect array 22, or other circuits within write state machine 32.

Forcing the state of write state machine 32 involves coupling a 2-1 multiplexer 703 to each output of next state logic 110. Test mode bits TDOUT(4:0) 356 form the second set of inputs to multiplexers 703. SLFRC 342 forces SBUS(4:0) 54 to the desired values by selecting between PLOUT(4:0) 114 and TDOUT(4:0) 356. This is because ISOSM 350 is inactive during tests that SLFLRC 342 is active.

Test bus driver 706 drives next state logic output signals 114 to DLC 80, where they are output on data pins. Test bus driver 706 drives outputs 114 onto test bus TBUS(4:0) when READLF is active.

Event counter 74 is modified to permit testing of its ECTRTC 90. Most of the modifications for such testing occur in other circuits. There is one relatively simple modification to event counter 74 to allow its testing, as shown in FIG. 11. Test bus driver 710 is coupled to ECTRTC 90, which is driven onto the test bus TBUS (4:0) when READL8 is active.

There are two types of modifications to period counter 76. The first type accommodates the testing of next state logic 110, while the second type accommodates testing of the period counter 76 itself. Both types of modifications are shown in FIG. 10. To allow the testing of next state logic 110 period counter output signals PVAL(14:0) 702 are driven to next state controller 72. Period counter 76 cycles through all its possible outputs when write state machine 34 is externally clocked while keeping the external reset applied on address pin A10 inactive. Test bus driver 712 facilitates the testing of PCTRTC 88. Test bus driver 712 is coupled to PCTRTC 88 and drives it to TBUS(2) when READL8 357 is active.

Them are a number of modifications to address counter 78 to allow testing, which are shown in in FIG. 12. One modification allows address pins A2 and A3 to be used for external clocking. Other modifications allow the address counter's count signal AQ(16:0) and terminal count signal ACTRTC 92 to be output to DLC 80. Test bus drivers 259a, 259b, 259c, and 259d, each receive four or five signals from counter 258. Test bus drivers 259 drive their four or five signal onto TBUS(4:0) when their associated selects, READL(C:8) are active. Test bus driver 259e operates similarly, driving ACTRTC 92 onto TBUS(4).

To write to any test register within flash memory 20 data latch comparator 80 must be modified because it is the gate keeper of data pins DATA(7:0) 26. DLC 80 now includes TBUS WRITE circuit 287. TBUS WRITE circuit 287 transfers from data pins DATA (7:3) 27 to test mode controller 29. During writes to test mode controller 29, latch write signal LATWRITEB 318 is brought active low. Data on DATA(7:3) 26 is then written into TBUS WRITE circuit 287 and output onto TBUS(4:0). TBUS(4:0) is then routed to test mode controller 29.

DLC 80 is also modified to allow MATCH 94 to be read dudng testing. This is accomplished easily with the addition of TBUS driver 289. MATCH 94 is driven onto TBUS(1) when READL8 is active.

Data is read from WSM 32 using read circuit 2000, illustrated in FIG. 25. TBUS(4:0) are selected by CSM 28 to be output onto data pads D(7:3) 26 during TEST LATCH reads. Data pads D(2:0) are driven to zero. Otherwise, sense amplifier outputs SOUT(7:0) 59 are selected.

No modifications of status register 34 were necessary to allow its testing.

In summary, a method of testing a write state machine 32 has been described. Write state machine 32 is tested on a circuit-by-circuit basis to insure that each circuit responds appropriately to critical conditions. A test mode controller allows the write machine to be forced into those critical conditions. Afterward, the response of each circuit can be determined by reading registers within the test mode controller.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of verifying operation of next state logic within a write state machine for automatically programming and erasing a flash memory, said method comprising the steps of:

(A) configuring in a test mode the write state machine, wherein the step of configuring in a test mode further includes:

a) decoupling an internal oscillator coupled to the next state logic;

b) coupling an external clock source to the next state logic;

c) logically isolating the next state logic from the remainder of the write state machine:

(B) cycling through possible inputs to the next state logic: and (C) comparing outputs from the next state logic to expected outputs.

2. The method of claim 1 wherein the step of configuring in a test mode further includes coupling inputs to the next state logic to a counter.

3. The method of claim 2 wherein cycling through possible inputs to the next state logic comprises cycling the counter through its count.

4. The method claim 3 wherein cycling said counter through said count includes incrementing said external clock.

5. A method of verifying the operation of next state logic within a write state machine for automatically programming and erasing a flash memory, said method comprising the steps of:

a) configuring the write state machine in a test mode by setting a first bit, a second bit, a third bit, and a fourth bit;

b) propagating the first bit, the second bit, the third bit, and the fourth bit to the write state machine;

c) coupling inputs from a counter to inputs to the next state logic in response to the first bit;

d) coupling external clock signals to the write state machine in response to the second bit;

e) forcing outputs of the next state logic to a known state in response to the third bit;

f) coupling an external reset signal to the write state machine in response to the fourth bit;

g) cycling through possible inputs to the next state logic by cycling the counter through its count; and h) comparing outputs from the next state logic to expected outputs.

6. The method claim 5 wherein the counter is cycled through its count in response to the external clock.

7. Circuitry for verifying the operation of next state logic within a write state machine on-board a flash memory, the write state machine automatically programming and erasing a flash memory, the circuitry comprising:

a) test registers for storing test signals;

b) first logic for isolating said next state logic from the write state machine in response to others of the test signals;

c) second logic for providing inputs to said next state logic in response to one of the test signals;

d) third logic for comparing outputs from the next state logic. expected outputs.

8. The circuitry of claim 7 wherein the first logic comprises a first multiplexing circuit having first inputs coupled to the write state machine and second inputs coupled to the second logic, the first multiplexing circuit having outputs coupled to inputs of the next state logic.

9. The circuitry of claim 7 further comprising fourth logic for providing an external clock to the write state machine in response to one of the test signals.

10. The circuitry of claim 8 wherein the first logic further comprises a fifth logic for setting outputs from the next state logic to a known state in response to one of the test signals.

11. The circuitry of claim 7 further comprising sixth logic for outputting the outputs from the next state logic.

12. Circuitry for verifying the operation of next state logic within a write state machine on-board a flash memory, the write state machine automatically programming and erasing a flash memory, the circuitry comprising:

a) a first test register for storing writable test signals;

b) a second test register for storing read-only signals from the next state logic;

c) first multiplexing means for coupling inputs to the next state logic, the first multiplexing means receiving a set of normal inputs from the write state machine and a set of alternate inputs from a counter, the first multiplexing means selecting between the normal inputs and alternate inputs in response a next state signal from the first test register;

d) means for forcing outputs of the next state logic to a known state in response to a force signal from the first test register;

e) second multiplexing means for coupling clock signals to the write state machine, the second multiplexing means receiving a first clock within the write state machine and a second clock external to the write state machine, the second multiplexing means selecting between the first clock and the second clock in response to a disconnect oscillator signal from the first test register; and f) a driver for coupling signals from the next state logic to the second test register.

13. A method of verifying the operation of an event counter within a write state machine for automatically programming and erasing a flash memory, the event counter generating a terminal count signal having an active state representing the end of an event, the flash memory including a test mode controller for altering the operation of the write state machine to allow testing, the method comprising the steps of:

a) configuring the test mode controller to test the event counter;

b) coupling an external clock signal to the event counter;

c) initializing a test count, the test count having a maximum value for the event;

d) toggling the external clock signal;

e) determining whether the terminal count signal is in the active state;

f) incrementing the test count; and g) repeating steps d) through e) until the count reaches its maximum value or the terminal count signal is in the active state.

14. The method of claim 13 wherein configuring the test mode controller comprises the steps of:

a) over-riding an internal reset signal using an external signal; and b) forcing the write state machine to a state in which the event counter is enabled to increment its count.

15. A method of verifying the operation of a period counter within a write state machine for automatically programming and erasing a flash memory, the period counter generating a terminal count signal having an active state representing the end of a time period, the flash memory including a test mode controller for altering the operation of the write state machine to allow testing, the method comprising the steps of:

a) configuring the test mode controller to test the period counter;

b) coupling an external reset signal to the write state machine, the reset signal having an inactive state enabling the operation of the period counter and an active state disabling the operation of the period counter;

c) bringing the external reset signal to its inactive state and starting a timer to determine a time period; and d) monitoring the terminal count signal to determine the time period to reach the active state.

16. The method of claim 15 wherein configuring the test mode controller comprises the steps of:

a) over-riding an internal reset signal using an external signal; and b) forcing the write state machine to a state in which the period counter is enabled to increment its count.

17. A method of verifying the operation of an address counter within a write state machine for automatically programming and erasing a flash memory, the flash memory including a test mode controller for altering the operation of the write state machine to allow testing, the method comprising the steps of:

a) configuring the test mode controller to test the address counter;

b) coupling an external clock signal to the address counter;

c) initializing the address counter;

d) toggling the external clock signal to advance a count of the address counter; and e) comparing the count of the address counter to an expected count.

18. The method of claim 17 wherein the step of configuring the test mode controller comprises the steps of:

a) over-riding an internal reset signal using an external signal; and b) forcing the write state machine to a state in which the address counter is enabled to increment its count.

19. A method of verifying the operation of a data latch comparator within a write state machine for automatically programming and erasing a flash memory, the data latch comparator generating a match signal to indicate whether a value stored in the flash memory corresponds to desired value, the data latch comparator generating the match signal by comparing memory array sense amplifier signals to a reference voltage, the flash memory including a test mode controller for altering the operation of the write state machine to allow testing, the method comprising the steps of:

a) configuring the test mode controller to test the data latch comparator by:

1) coupling an external clock signal to the data latch comparator;

2) coupling an external reset signal to the write state machine, the reset signal having an inactive state enabling the operation of the data latch comparator and an active state disabling the operation of the data latch comparator;

3) coupling a first forcing signal to the data latch comparator to select the reference voltage;

4) coupling a second forcing signal to the data latch comparator to set the output signals from the sense amplifiers;

b) bringing the external reset signal to its inactive state;

c) toggling the external clock signal; and d) comparing the match signal to an expected value.

20. A method of verifying the operation of a status register within a write state machine for automatically programming and erasing a flash memory, the status register generating a fail signal to indicate whether a program event or erase event was successfully executed, the flash memory including a test mode controller for altering the operation of the write state machine to allow testing, the method comprising the steps of:

a) configuring the test mode controller to test the status register by:

1) coupling an external clock signal to the status register;

2) coupling an external reset signal to the write state machine, the reset signal having an inactive state enabling the operation of the status register and an active state disabling the operation of the status register;

3) coupling a first forcing signal to the write state machine to force the write state machine to fail state;

b) bringing the external reset signal to its inactive state;

c) toggling the external clock signal; and d) comparing the fail signal to an expected value.

* * * * *

UNITED STATES PATENT AND TRADEMARK OFFICE
CERTIFICATE OF CORRECTION

PATENT NO. : 5,369,647
DATED : November 29, 1994
INVENTOR(S) : Kreifels, et. al.

It is certified that error appears in the above-indentified patent and that said Letters Patent is hereby corrected as shown below:

In column 2 at line 49 delete "wide" and insert --write--

In column 2 at line 59 delete "wide" and insert --write--

In column 5 at line 35 delete "wide" and insert --write--

In column 5 at line 47 delete "in" and insert --In--

In column 8 at line 18 delete "wide" and insert --write--

In column 11 at line 45 delete "in" and insert --In--

In column 12 at line 35 delete "wide" and insert --write--

In column 15 at line 3 delete "wide" and insert --write--

In column 15 at line 49 delete "10" and insert --IO--

In column 17 at line 37 delete "wide" and insert --write--

In column 21 at line 22 delete "wide" and insert --write--

UNITED STATES PATENT AND TRADEMARK OFFICE
CERTIFICATE OF CORRECTION

PATENT NO. : 5,369,647
DATED : November 29, 1994
INVENTOR(S) : Kreifels, et. al.

It is certified that error appears in the above-indentified patent and that said Letters Patent is hereby corrected as shown below:

In column 21 at line 36 delete "Section 1IB." and insert --Section IIB.--

In column 22 at line 47 delete "Section 1IB." and insert --Section IIB.--

In column 23 at line 33 delete "In" and insert --If--

In column 27 at line 34 delete "ILAT" and insert --LAT--

In column 27 at line 65 delete "PRG FALL," and insert --PRG FAIL,--

In column 27 at line 66 delete "ERASE FALL." and insert --ERASE FAIL.--

UNITED STATES PATENT AND TRADEMARK OFFICE
CERTIFICATE OF CORRECTION

PATENT NO. : 5,369,647
DATED : November 29, 1994
INVENTOR(S) : Kreifels, et. al.

It is certified that error appears in the above-indentified patent and that said Letters Patent is hereby corrected as shown below:

In column 28 at line 6 delete "ERASE FA1L bit and the PRG FA1L bit." and insert --ERASE FAIL bit and the PRG FAIL bit.--

In column 30 at line 8 delete "Them" and insert --There--

In column 30 at line 32 delete "dudng" and insert --during--

In column 31 at line 55 delete "logic." and insert --logic to--

Signed and Sealed this

Sixth Day of May, 1997

Attest:

BRUCE LEHMAN

Attesting Officer

Commissioner of Patents and Trademarks